(12) United States Patent
Polley et al.

(10) Patent No.: US 12,228,121 B2
(45) Date of Patent: Feb. 18, 2025

(54) TRANSPORT DEVICE HAVING AN ACTUATOR AND SEPARATING LAYER

(71) Applicant: HNP Mikrosysteme GmbH, Schwerin (DE)

(72) Inventors: Tim Polley, Schwerin (DE); Thomas Weisener, Schwerin (DE); Gerald Voegele, Sindelfingen (DE); Sven Reimann, Ludwigslust (DE)

(73) Assignee: HNP MIKROSYSTEME GMBH, Schwerin (DE)

( * ) Notice: Subject to any disclaimer, the term of this patent is extended or adjusted under 35 U.S.C. 154(b) by 582 days.

(21) Appl. No.: 17/295,917

(22) PCT Filed: Nov. 21, 2019

(86) PCT No.: PCT/IB2019/060042
§ 371 (c)(1),
(2) Date: May 4, 2022

(87) PCT Pub. No.: WO2020/104996
PCT Pub. Date: May 28, 2020

(65) Prior Publication Data
US 2022/0282722 A1    Sep. 8, 2022

(30) Foreign Application Priority Data
Nov. 23, 2018    (DE) .......................... 102018129634.7

(51) Int. Cl.
*F04B 43/04*    (2006.01)
*F03G 7/06*    (2006.01)
(Continued)

(52) U.S. Cl.
CPC .......... *F04B 43/04* (2013.01); *F03G 7/06147* (2021.08); *F04B 53/16* (2013.01);
(Continued)

(58) Field of Classification Search
CPC ........ F04B 43/04; F04B 43/043; F04B 53/16; F04B 2203/0405; F04B 2205/07; F03G 7/06147; H01N 35/01; H01N 35/80
See application file for complete search history.

(56) References Cited

U.S. PATENT DOCUMENTS 4,917,579 A * 4/1990 Torma .................... F04B 43/084
  417/474
5,961,298 A * 10/1999 Bar-Cohen ............ F04B 17/003
  417/322

(Continued)

FOREIGN PATENT DOCUMENTS

DE    102013009592 A1    12/2014
DE    102013221744 A1    4/2015
(Continued)

OTHER PUBLICATIONS

European Patent Office/ISA, International Search Report for PCT/IB2019/060042, dated Mar. 5, 2020.
(Continued)

*Primary Examiner* — Charles G Freay
(74) *Attorney, Agent, or Firm* — DUANE MORRIS LLP

(57) ABSTRACT

A transport device (100) comprises a housing (110), an actuator (130) and a drive (150). The housing has a fluid inlet (111, 113) and a fluid outlet (113, 111). The actuator (130) comprises a magnetic shape-memory alloy, and the actuator (130) is arranged at least in sections in the housing (110). The actuator (130) can be deformed by the drive (150) in such a way that at least one cavity (135, 135') for the fluid is formed in the actuator (130), which cavity can be moved by the drive (150) in order to transport the fluid in the cavity (135, 135') from the fluid inlet (111, 113) to the fluid outlet (113, 111). At least one section of the actuator (130) has a separation layer (1380) by which a direct contact between (Continued)

the fluid and the actuator (130) is prevented in said section of the actuator (130).

35 Claims, 18 Drawing Sheets

(51) Int. Cl.
  *F04B 53/16* (2006.01)
  *H10N 35/01* (2023.01)
  *H10N 35/80* (2023.01)
(52) U.S. Cl.
  CPC .............. *H10N 35/01* (2023.02); *H10N 35/80* (2023.02); *F04B 43/043* (2013.01); *F04B 2203/0405* (2013.01); *F04B 2205/07* (2013.01)

(56) References Cited

U.S. PATENT DOCUMENTS

| | | | |
|---|---|---|---|
| 6,435,840 B1* | 8/2002 | Sharma | F04B 43/14 417/474 |
| 6,450,773 B1 | 9/2002 | Upton | |
| 6,515,382 B1 | 2/2003 | Ullakko | |
| 8,966,991 B2 | 3/2015 | Ullakko et al. | |
| 9,091,251 B1 | 7/2015 | Ullakko et al. | |
| 10,428,808 B2 | 10/2019 | Humburg | |
| 10,535,457 B2* | 1/2020 | Mullner | H01F 1/0308 |
| 11,177,062 B2 | 11/2021 | Laufenberg et al. | |
| 2004/0234401 A1* | 11/2004 | Banister | F04B 43/14 417/474 |
| 2009/0112155 A1* | 4/2009 | Zhao | F04B 43/046 417/63 |
| 2016/0087553 A1 | 3/2016 | Mullner | |
| 2016/0211065 A1 | 7/2016 | Mullner et al. | |
| 2018/0149152 A1 | 5/2018 | Asai et al. | |
| 2018/0209552 A1 | 7/2018 | Gould et al. | |
| 2022/0257490 A1 | 8/2022 | Lechner et al. | |
| 2022/0275799 A1 | 9/2022 | Polley et al. | |
| 2022/0282722 A1 | 9/2022 | Polley et al. | |

FOREIGN PATENT DOCUMENTS

| | | |
|---|---|---|
| DE | 102016110669 A1 | 12/2017 |
| DE | 102018129631 B3 | 3/2020 |
| DE | 102018129633 B3 | 3/2020 |
| DE | 102018129634 B3 | 3/2020 |
| DE | 102018129635 B3 | 3/2020 |
| DE | 102018215467 A1 | 3/2020 |
| DE | 102019210691 A1 | 1/2021 |
| JP | 2002228033 | 8/2002 |
| JP | 2002228033 A1 | 8/2002 |
| WO | 2004065290 A2 | 8/2004 |
| WO | 2008150210 | 12/2008 |
| WO | 2008150210 A1 | 12/2008 |
| WO | 2012019599 A2 | 2/2012 |
| WO | 2015031216 A1 | 3/2015 |
| WO | 2019/008235 A1 | 1/2019 |

OTHER PUBLICATIONS

Saren, A. et al., "Integratable magnetic shape memory micropump for high pressure, precision microfluidic applications", Microfluidics and Nanofluidics (2018) 22:38, https://doi.org/10.1007/s10404-018-2058-0, 10 pgs.

Barker, Samuel et al., "Magnetic shape memory micropump for submicroliter intracranial drug delivery in rats", Journal of Medical Devices, Dec. 2016, vol. 10, 041009-1 to 041009-6.

Smith, Aaron R. et al., "Characterization of a high-resolution solid-state micropump that can be integrated into microfluidic systems", Microfluid Nanofluid (2015) 18:1255-1263, DOI 10.1007/s10404-014-1524-6.

Ullakko, K. et al., "A magnetic shape memory micropump: contact-free, and compatible with PCR and human DNA profiling", Smart Mater. Struct. 21 (2012) 115020 (10pp), doi:10.1088/0964-1726/21/11/115020.

Smith, A.R. et al., "A contact-free micropump for fluid transport against high backpressure", The 4th Conference on MicroFluidic Handling Systems, Oct. 2-4, 2019, Enschede, The Netherlands, pp. 43-44.

Harmel, Andre et al., "Media-separated micropump consisting of magnetic shape memory alloy actuator", Actuator 20022, Jun. 29-30, 2022, pp. 47-50, ISBN 978-3-8007-5894-4.

Saren A. et al. "Integratable magnetic shape memory micropump for high-pressure, precision microfluidic applications" Microfluidics and Nanofluidics (2018) 22:38, Mar. 16, 2018, pp. 1-10.

First Examination Report issued Jul. 24, 2024 in corresponding Chinese application No. 2019 8008 8252.5.

* cited by examiner

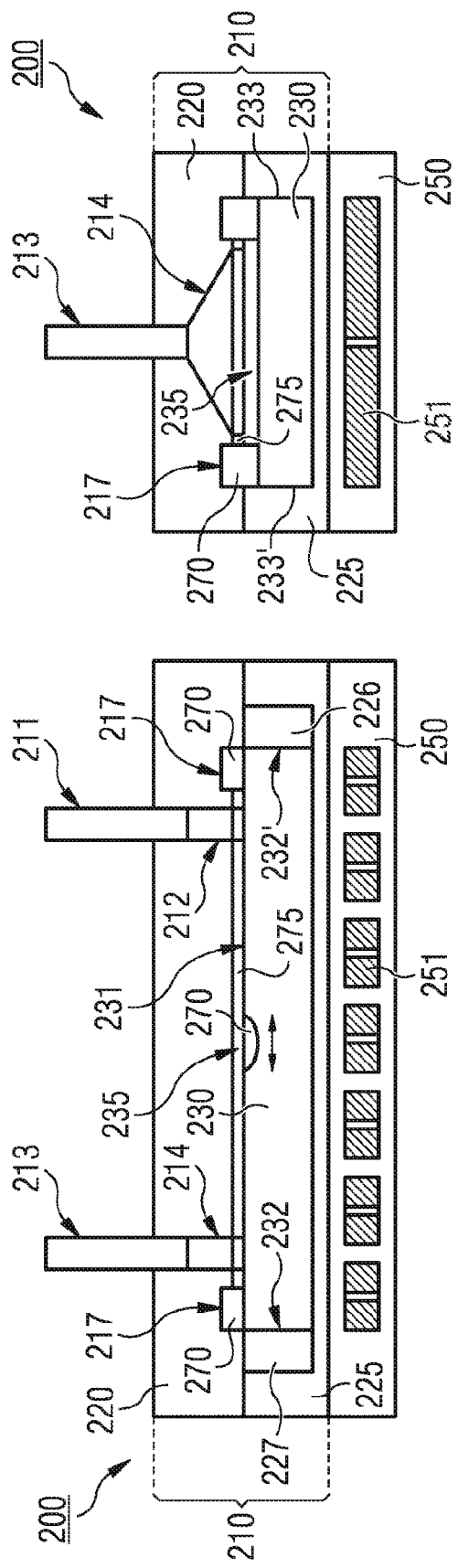
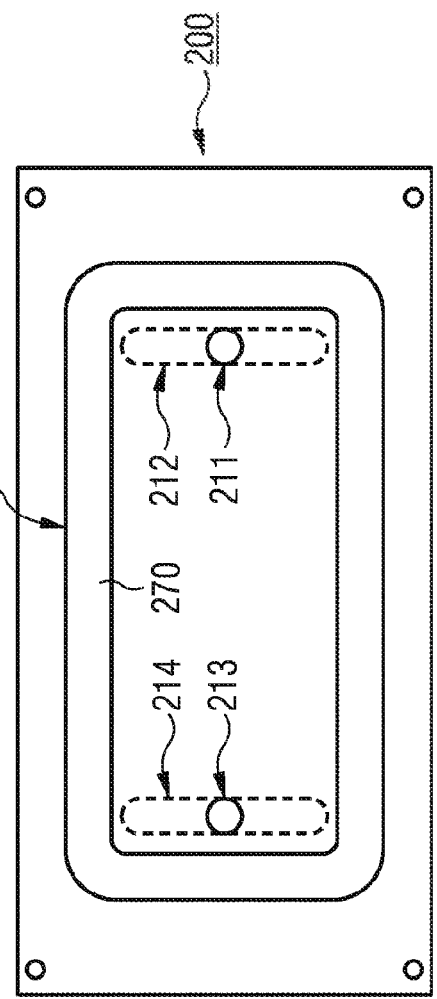
FIG. 2b
FIG. 2c
FIG. 2d

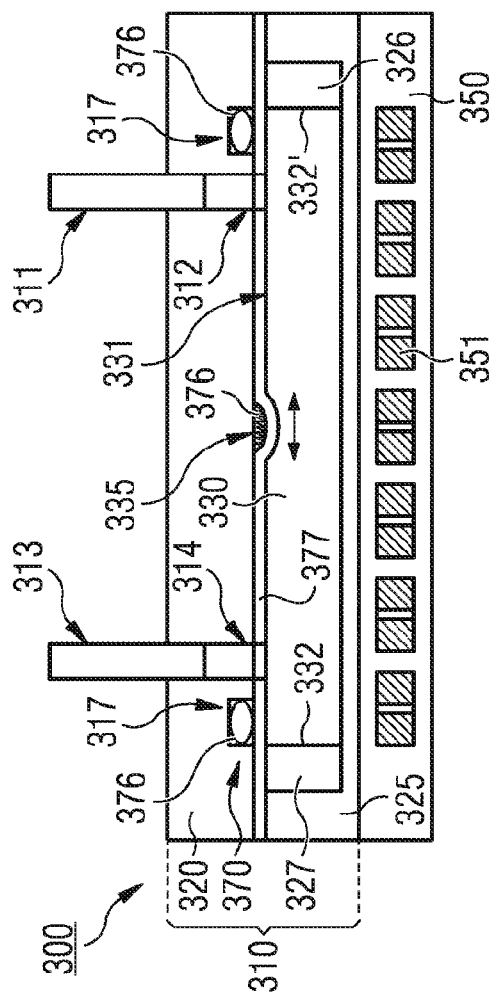
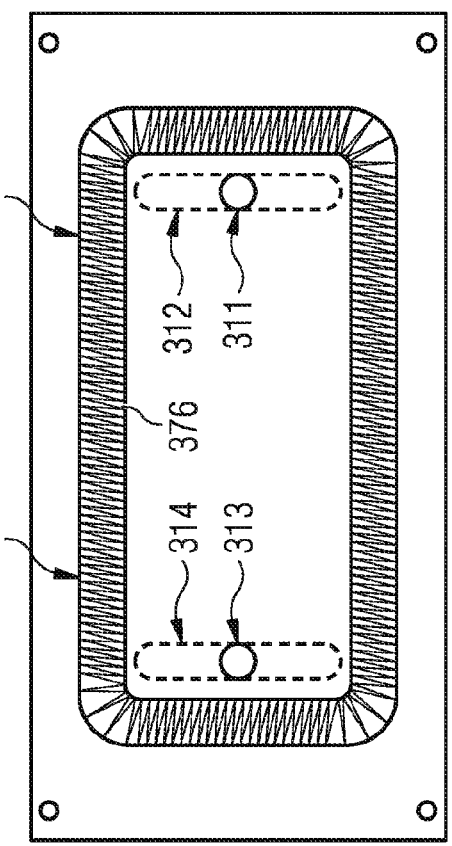

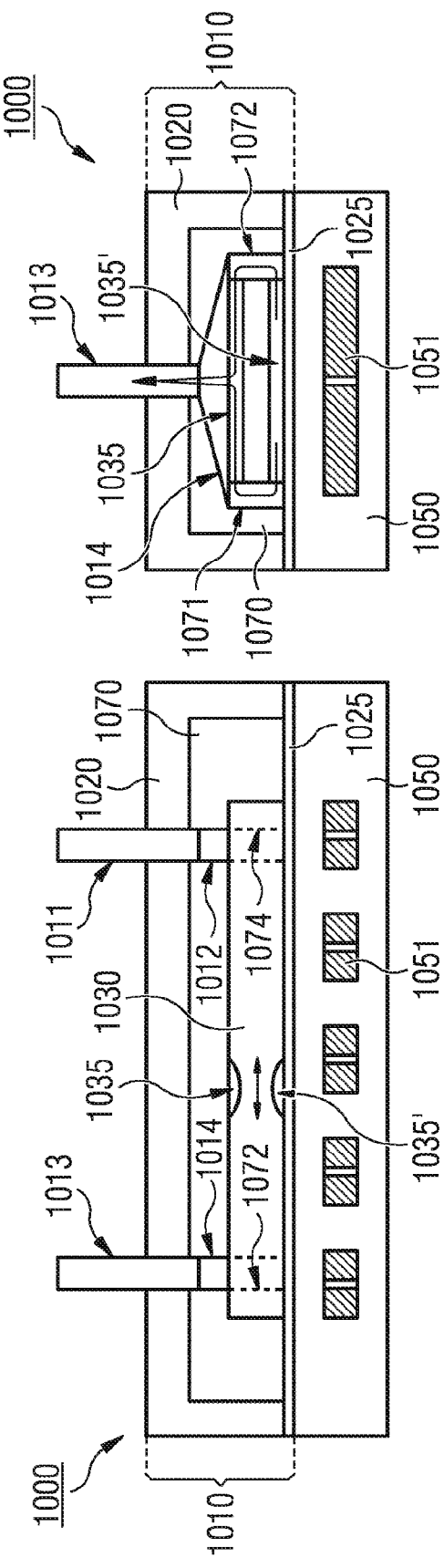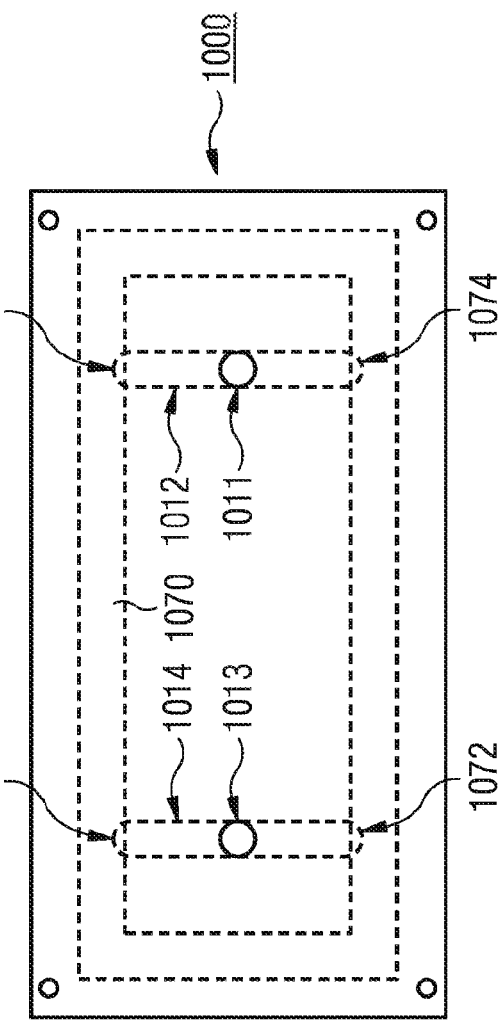

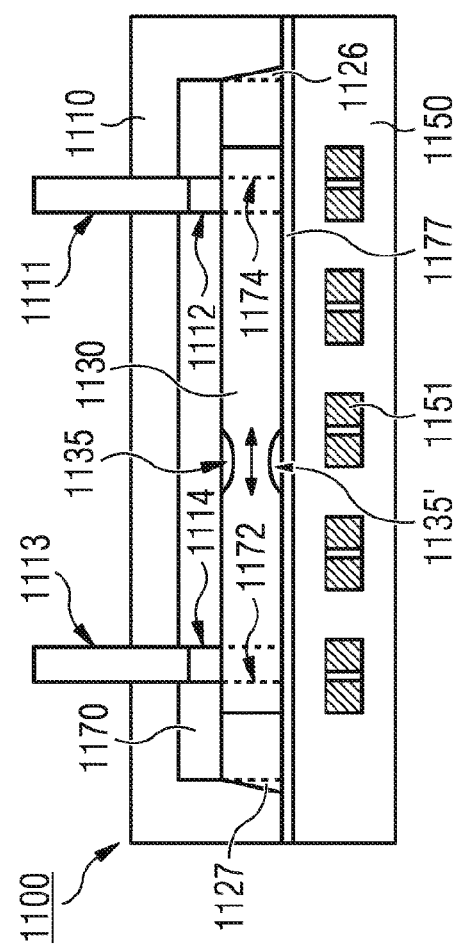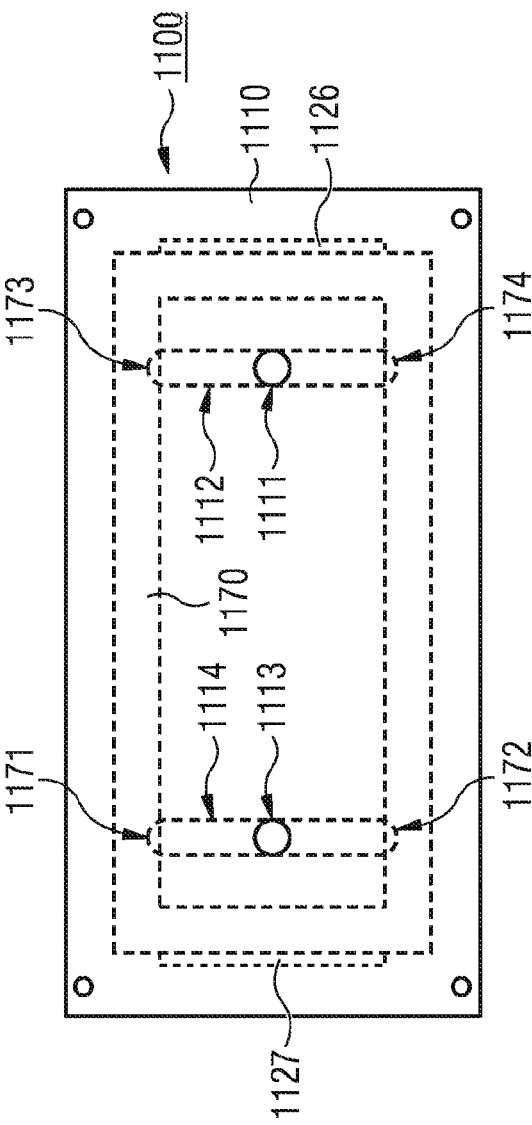

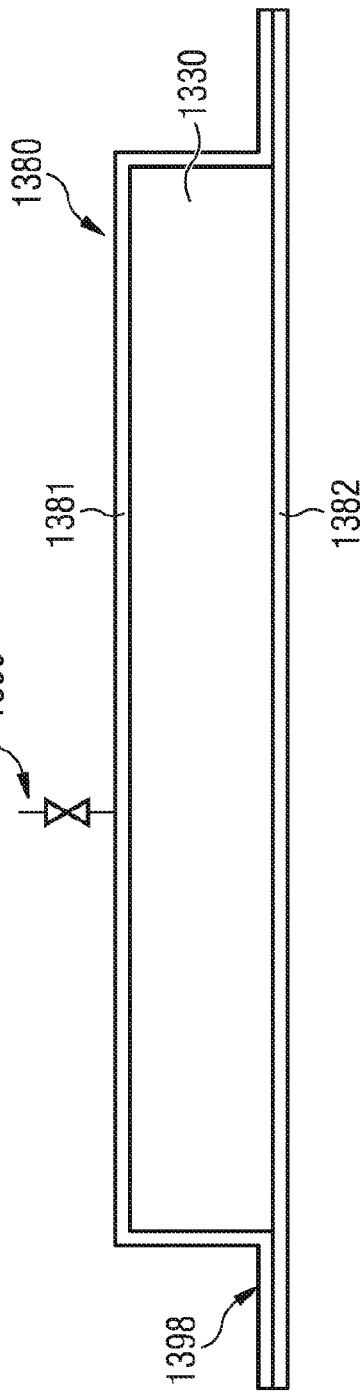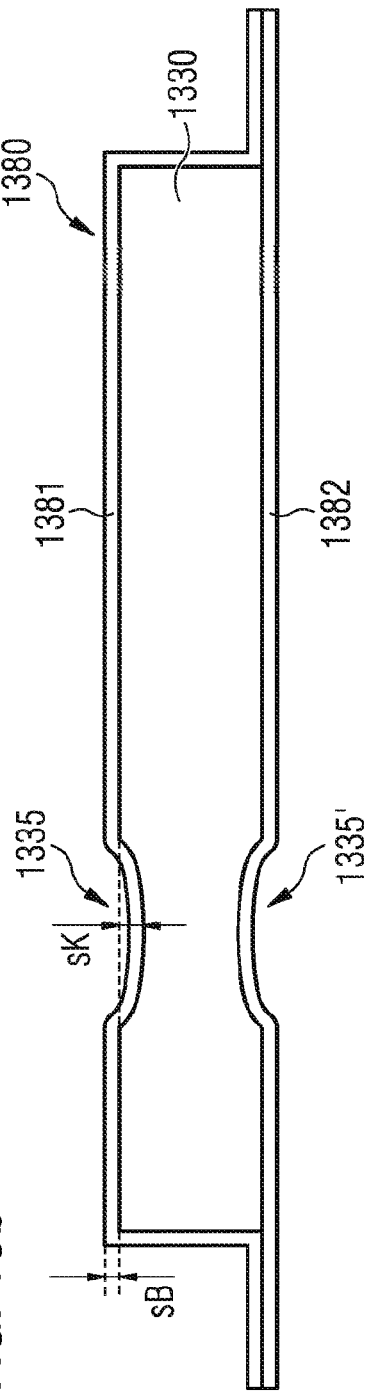

TRANSPORT DEVICE HAVING AN ACTUATOR AND SEPARATING LAYER

The invention relates to a transport device comprising an actuator with a shape-memory alloy, wherein the actuator has a separation layer.

Shape-memory alloys can exist in various crystal structures, the shape of the material being dependent on the crystal structure present in the alloy.

Specific shape-memory alloys comprise magnetic shape-memory alloys, MSMAs, the shape of which can be changed by applying a magnetic field thereto. Twin boundaries in magnetic shape-memory alloys can be moved by a magnetic field, thereby causing a magnetically induced reorientation of the material. The material can be stretched by a perpendicular magnetic field and the material can be contracted by a parallel magnetic field.

The basic principle of a magnetic-field induced shape change of an actuator made of a material with a twin boundary is disclosed in U.S. Pat. No. 6,515,382 B1.

The use of a magnetic shape-memory alloy as an actuator in a pump is known from US 2016/0211065 A1. Therein, an actuator made of an MSMA is described which is arranged in a housing having an inlet and an outlet. A plurality of coils, by which by a magnetic field can be generated, are arranged below the actuator. By generating a magnetic field, the shape of the MSMA can be changed in such a way that a cavity is formed which is in communication with the inlet. A fluid flows into the cavity and the cavity filled with the fluid is moved by a movement of the magnetic field. When the filled cavity is in communication with the outlet, the fluid in the cavity flows out of the outlet.

Known pumps having an actuator that comprises a magnetic shape-memory alloy are not suited for all media to be conveyed. Specifically, such known pumps lack biocompatibility.

It is an object of the invention to provide a transport device by which a wide spectrum of fluids, even sensible fluids can be conveyed or transported. In addition, an increased fluid volume flow is to be conveyed or transported. It is another object to provide a transport device with a sealing structure that enables an improvement of the pressure build-up. It is a further object to provide a transport device with a sealing structure by which leakage during the transport of a fluid is reduced. It is still a further object to provide a transport device which can be manufactured in a process secure way and at low cost. The operation of the transport device is to be monitored in an improved manner or the operation is to be controlled in an improved manner.

The object is achieved by a transport device according to claim 1.

A transport device for transporting a fluid comprises a housing, an actuator and a drive. The housing comprises a fluid inlet and a fluid outlet. The actuator comprises a magnetic shape-memory alloy (MSMA) and is arranged at least in sections in the housing. The drive can deform the actuator in such a way that a cavity for the fluid is formed in the actuator, which cavity can be moved by the drive in order to transport the fluid in the cavity from the fluid inlet to the fluid outlet. At least one section of the actuator has a separation layer. A direct contact between the fluid and the actuator is prevented by the separation layer in the section of the actuator provided with the separation layer.

The direct contact refers to a contact between the actuator and the fluid without a separation layer.

Specifically, the transport device can be a turbo-machine device. The turbo-machine device is able to transport or convey both incompressible and compressible media. Incompressible media are such media that are substantially incompressible or hardly compressible. An incompressible medium is at least much less compressible than a gas.

The transport device can be a pump device for transporting a liquid. Specifically, the transport device is a micro-pump device. A micro-pump device can have a maximum pump capacity of at most 10 ml per minute, specifically at most 1 ml per minute.

The magnetic shape-memory alloy can be a nickel manganese gallium alloy.

Preferably, the actuator is made of a magnetic shape-memory alloy.

The actuator can be a pump actuator.

The actuator can be arranged completely in the housing so that it is completely enclosed by the housing or, when one or more sides of the housing are open, the actuator cannot protrude beyond the one or more sides of the housing.

The actuator can have two end faces, two side faces and two cavity faces. At least one cavity can be formed in each one of the two cavity faces.

A cavity can be a (closed) hollow space or a hollow (constriction or indentation) having one or more openings.

The actuator can have a substantially cuboid shape.

The cavity faces have a considerably larger surface area than the side faces or the end faces, preferably the surface areas of the cavity faces are larger by a multiple than the surface areas of the side faces or the end faces. Due to the formation of the cavities in the actuator, the actuator is expanded specifically towards the end faces (volume stability).

A homogeneously directed travelling magnetic field can be generated by the drive. For this purpose, the drive comprises especially electromagnetic coils and/or permanent magnets. Specifically, a plurality of travelling magnetic fields can be simultaneously generated and moved on the same cavity face by the drive.

The separation layer can extend across an entire side of the actuator. Specifically, the separation layer extends across an entire cavity face of the actuator.

The actuator can have a total surface and the separation layer can extend across at least 80% or 90% of the total surface of the actuator.

In particular, the separation layer extends across the entire surface of the actuator.

The thickness of the separation layer can be less than the maximum depth of the cavity. Specifically, the thickness of the separation layer can be a mean value of the thickness of the separation layer. The maximum depth of the cavity can be the maximum depth of a cavity that can be formed in one of the cavity faces.

The separation layer can be film. Specifically, the film is a plastic film comprising, for example, polyethylene or polypropylene.

A negative pressure can prevail between the film and the actuator as compared to the surroundings of the film. Thus, there is a close connection between the film and the actuator, which connection follows a shape change of the actuator.

The film can comprise a valve. Specifically, the pressure between the film and the actuator can be changed via the valve.

The film can have a weld. For applying the separation layer to the actuator, for example, two film elements can be laid around the actuator and the film elements can be welded to each other in such a way that the film is placed airtight around the actuator.

A liquid can be present between the film and the actuator. Specifically, silicone oil can be used as a liquid. The liquid can apply an adhesion force between the film and the actuator and reduce friction that is caused between the film and the actuator (when the actuator is deformed).

The separation layer can be a coating. In particular, the coating is connected to the actuator in a firmly adhering manner.

The coating can comprise a parylene.

The parylene can be a parylene which is completely substituted with hydrogen (parylene N). The parylene can also be a parylene which is substituted with halogen. In particular, the parylene is a parylene which is partially substituted with chlorine (parylene C or parylene D). Likewise, the parylene can be a parylene which is partially substituted with fluorine (parylene HT).

The coating can be applied to actuator by chemical vapor deposition (CVD), physical vapor deposition (PVD), cathode evaporation or resublimation. Specifically, the coating is applied to the actuator by resublimation.

An adhesion-promoting agent can be provided between the actuator and the separation layer. The adhesion-promoting agent can act as an agent between the physical and/or chemical properties of the actuator surface and the separation layer.

The device (transport device) can comprise a sealing element. The sealing element can be designed and arranged between the actuator and the housing in such a way that the cavity is edge-sealed or end-sealed during the transport of the fluid from the fluid inlet to the fluid outlet.

At least one section of the sealing element can have an elastic property. This section of the sealing element can sealingly abut against an edge-side or end-side section of the cavity of the actuator when a cavity is formed in the actuator.

Thus, the section of the sealing element can abut against the actuator when no cavity is formed and due to the elastic property of the section of the sealing element, the sealing element can abut against the cavity of the actuator when such a cavity is formed in the actuator.

The elastic property can be a linear elastic property or a non-linear elastic property.

The sealing element is to be compressible upon application of a force and is to reassume at least in part its original shape after termination of the application of the force. Specifically, when compressed by a force, the sealing element is to exert a force counteracting the compression. This enhances the sealing function thereof.

The housing can have a groove, wherein at least one section of the sealing element can be arranged in the groove.

The opening of the groove can face towards the actuator.

The groove of the housing can be designed in such a way that the groove surrounds or encloses a face section of the housing. Specifically, the groove is continuous and completely surrounds the face section of the housing or completely encloses the face section of the housing.

The sealing element in the groove can also surround or enclose the face section of the housing, in particular the sealing element can continuously (completely) surround or enclose the face section of the housing.

The face section of the housing surrounded or enclosed by the groove or the sealing element can comprise the fluid inlet and/or the fluid outlet.

Together with the sealing element in the groove, an area is formed on the actuator which (substantially) corresponds to the face section of the housing enclosed by the groove, in which area a fluid can be transported (in the cavity) from the fluid inlet to the fluid outlet, wherein this area is sealed to the outside even when a cavity is present.

The actuator can be deformed by the drive in such a way that two cavities for the fluid are formed in the actuator, which cavities can be moved by the drive. The fluid can be transported in the cavities from the fluid inlet to the fluid outlet.

The device can comprise a sealing element that has at least one recess. The sealing element can be arranged in the housing in such a way that the cavities are at least temporarily (over a limited period) in fluid communication via the recesses during the transport of the fluid from the fluid inlet to the fluid outlet.

By using two cavities in the actuator for transporting the fluid, the volume flow that can be transported through the transport device can be increased.

Typically, two cavities are formed in the actuator on opposite sides of the actuator. The formed cavities are in fluid communication in the area of the recess in the sealing element. When one of the cavities connected in fluid communication is in turn connected in fluid communication with the fluid inlet, the fluid can flow into the two cavities via the fluid inlet. By moving the magnetic field of the drive, the cavities can be moved towards the fluid outlet. When the cavities arrive at the fluid outlet so that one of the cavities is in fluid communication with the fluid outlet and the cavities are in fluid communication with each other, the transported fluid can flow from the two cavities via the fluid outlet out of the transport device.

The actuator can be deformed in such a way that the cavities are formed on opposite sides of the actuator.

The sealing element can comprise at least two recesses. In particular, the two recesses can be formed in the sealing element in such a way that no fluid communication between the recesses is possible when the fluid is transported from the fluid inlet to the fluid outlet.

In particular, one of the two recesses can be formed in the area of the fluid inlet and the other one of the two recesses can be formed in the area of the fluid outlet.

Specifically, a distance between the fluid inlet or a diffusor and one of the recesses can be less than 100 mm, especially less than 50 mm, specifically less than 20 mm, and/or a distance between the fluid outlet or a diffusor and one of the recesses can be less than 100 mm, especially less than 50 mm, specifically less than 20 mm.

The sealing element can comprise four recesses, specifically two of the recesses can be formed in such a way that the two recesses are at least temporarily in fluid communication (from one cavity or from both cavities) during the transport of the fluid from the fluid inlet to the fluid outlet.

The other two of the recesses can be formed in a similar way so that they are at least temporarily in fluid communication during the transport of the fluid from the fluid inlet to the fluid outlet. Likewise, from one or from both cavities.

The sealing element can contact at least in sections at least two faces of different sides of the actuator. Specifically, the sealing element can contact at least in sections the side faces of the actuator.

The housing can have an upper side, wherein the upper side is substantially in parallel with the side of the actuator in which a major part (at least 50%) of one of the cavities is to be formed. The fluid inlet and/or the fluid outlet can protrude from the upper side of the housing. The fluid inlet and/or fluid outlet can protrude from a side of the housing that is lateral to the upper side of the housing.

The transport device can comprise a first sealing membrane and a second sealing membrane. The first sealing membrane can contact a side of the actuator and the second sealing membrane can contact another side of the actuator.

Preferably, the first sealing membrane and the second sealing membrane contact opposite sides of the actuator.

The transport device can comprise a clamping element that has a trapezoidal basic shape and abuts against a side of the actuator. The clamping element can be substantially incompressible.

The clamping element can contact the housing and/or the sealing element.

A counter-structure can be provided in the housing which is adapted to receive at least in sections the trapezoidal clamping element. The transport device can also comprise two clamping elements that each have a trapezoidal basic shape. One of the clamping elements can abut against a side of the actuator and the other one of the clamping elements can abut against another side of the actuator.

In particular, one of the clamping elements can abut against a side of the actuator and the other one of the clamping elements can abut against an opposite side of the actuator.

The clamping element(s) can extend along the entire length of the respective contacted side of the actuator.

The transport device can comprise at least one clamping element that contacts a side face, especially an end face of the actuator and by which a mechanical restoration of the actuator is ensured. Preferably, the transport device comprises two clamping elements that contact opposite side faces, especially end faces of the actuator and enable a mechanical restoration of the actuator.

When a cavity is formed in the actuator (by the drive), the actuator expands in one or more directions, wherein this typically takes places towards the end faces of the actuator. For example, when a magnetic field of the drive is terminated, the cavity is not restored without a cause, but by application of a mechanical force by means of the clamping elements.

At least one clamping element, preferably two clamping elements can have a trapezoidal basic shape.

The device, especially the housing or the sealing element or the clamping element(s) can also comprise at least one, preferably at least two magnets by means of which a magnetic restoration of the actuator is possible. Specifically, the magnet(s) can be one or more permanent magnets or electromagnets.

The magnetic restoration of the actuator works analogously to the mechanical restoration of the actuator, as described above.

The device, especially the housing or the sealing element or the clamping element(s) can also comprise a magnetorheological elastomer.

The housing can comprise at least one diffusor. Specifically, the housing comprises two diffusors.

Since a cavity is usually generated across the entire width of the actuator, a diffusor at the fluid inlet and/or a diffusor at the fluid outlet enables an improved fluid guidance from the fluid inlet into the cavity and/or from the cavity to the fluid outlet.

A diffusor can be connected to the fluid inlet and a further diffusor can be connected to the fluid outlet. The cross-sectional area of the diffusor at the end of the diffusor that is closer to the actuator can be larger than the cross-sectional area of the end of the diffusor that is more remote from the actuator. This can apply to all diffusors.

The sealing element can comprise an elastomer. In particular, the elastomer can be a thermoplastic elastomer.

Alternatively or in addition, the sealing element can comprise a foam material. Specifically, the foam material is a closed-cell foam material.

The housing can comprise a metal or a plastic material, preferably the housing is made of metal or plastic material. Preferably, the housing is made of an elastomer (thermoplastic elastomer) or comprises an elastomer (thermoplastic elastomer). Alternatively or in addition, the housing can comprise a gradient material or be made of a gradient material.

The housing of the transport device can comprise at least in sections a PTFE (polytetrafluoroethylene) coating. Preferably, at least the face of the housing that is a boundary surface of the cavity is coated with PTFE.

In the actuator of the transport device, at least two, especially a plurality of cavities can be formed simultaneously in the actuator. For example, by means of a suitable design of the drive. The at least two cavities can be formed and moved on the same side of the actuator.

The transport device can comprise at least one sensor. Preferably, the sensor is attached to the housing.

The transport device can comprise a temperature sensor that measures the temperature of the actuator. A control unit can change the operation of the transport device based on the value detected by the temperature sensor. In particular, the control unit can change the operation of the transport device when the temperature value of the actuator detected by the temperature sensor exceeds and/or falls below a defined temperature threshold value.

The transport device can comprise an optical sensor by which it can be detected if a cavity is present in the actuator or not. The optical sensor can be designed in such a way that the frequency of cavities in the actuator is detected in an area of the actuator. Based on the value measured by the optical sensor, a control unit of the device can change the operation of the transport device. In particular, the volume flow of the fluid through the transport device can be detected by the optical sensor and the transport device can be regulated based on the detected value.

The transport device can comprise a pressure sensor that detects the pressure at the fluid inlet or at the fluid outlet. The transport device can also comprise two pressure sensors, wherein one pressure sensor each detects the pressure at the fluid inlet and at the fluid outlet. Based on the value detected by at least one of the pressure sensors, the operation of the transport device can be changed (e.g. by a control unit).

The transport device can also comprise a differential pressure sensor that detects or measures a pressure differential between the fluid inlet and the fluid outlet. The differential pressure sensor can comprise two pressure sensors before the fluid inlet or two pressure sensors after the fluid outlet.

The operation of the transport device can be changed based on the value detected by the differential pressure sensor, for example, by a control unit.

The device can comprise at least one piezo sensor, wherein the actuation of the actuator can be detected or measured by the at least one piezo sensor. Based on the value detected or measured by the at least one piezo sensor, the operation of the transport device can be changed, for example, by a control unit. The transport device can also comprise two piezo sensors which are preferably arranged on opposite sides of the actuator.

The transport device can comprise one, preferably two strain gauges. The actuation of the actuator can be detected or measured by the at least one strain gauge. In particular, the value detected or measured by the strain gauge or strain gauges can be used to change the operation of the transport device.

An actuator comprising a separation layer can be manufactured by a method. The actuator comprises a magnetic shape-memory alloy. In the method, the actuator is provided and a separation layer is applied to at least one side of the actuator.

The separation layer can be applied to at least 80% of the total surface of the actuator. In particular, the separation layer is applied to at least 90% of the total surface of the actuator. Particularly preferably, the separation layer is applied to the entire surface of the actuator.

The separation layer can be a film, specifically a plastic film. The film can comprise a valve.

The film can be placed or laid around the actuator and a vacuum can be generated between the film and the actuator. Thus, the film rests tightly against the actuator.

The film can be welded in at least one place.

A liquid can be introduced between the separation layer and the actuator. Specifically, the liquid can be silicone oil (diorganopolysiloxane).

The separation layer can be applied to the actuator by a phase transition.

Specifically, the phase transition is a transition from a gas phase to a solid phase.

Specifically, the phase transition can be a resublimation.

Specifically, a parylene is applied to the actuator to form a coating on the actuator.

The embodiments of the invention are illustrated by examples, however, not in a way that transfers or incorporates limitations from the Figures into the patent claims. Same reference numerals in the Figures denote same elements.

FIG. 2b shows the transport device 200 in a schematic front view;

FIG. 2c shows the transport device 200 in a schematic side view;

FIG. 2d shows the transport device 200 in a schematic top view;

FIG. 3b shows the transport device 300 in a schematic front view;

FIG. 3c shows the transport device 300 in a schematic side view;

FIG. 3d shows the transport device 300 in a schematic top view;

FIG. 10b shows the transport device 1000 in a schematic front view;

FIG. 10c shows the transport device 1000 in a schematic side view;

FIG. 10d shows the transport device 1000 in a schematic top view;

FIG. 11b shows the transport device 1100 in a schematic front view;

FIG. 11c shows the transport device 1100 in a schematic side view;

FIG. 11d shows the transport device 1100 in a schematic top view;

FIG. 13a shows an actuator 1330 with a separation layer 1380;

FIG. 13b shows an actuator 1330 with a separation layer 1380 and two cavities 1335a, 1335b.

In FIGS. 1a to 1d, an embodiment of a transport device 100 is shown.

Figure 1A:
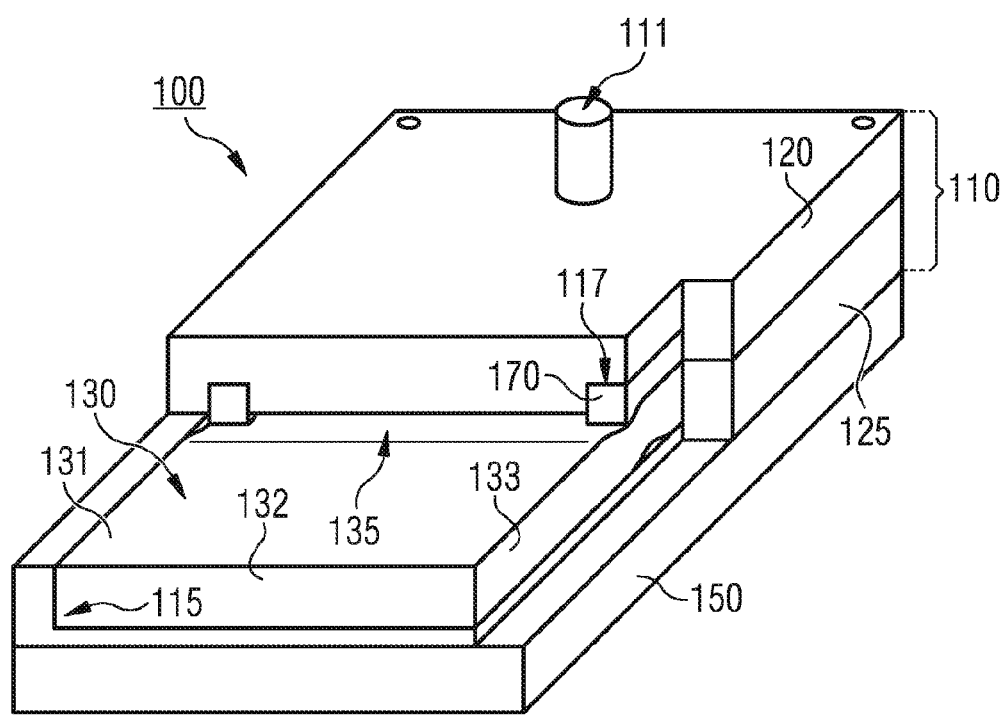
FIG. 1a shows a transport device 100 in a schematic, partially sectioned view.

Specifically, the transport device 100 is a pump, more specifically a micro-pump. In FIG. 1a, the transport device 100 is shown in a perspective and schematic view with some broken out sections. The transport device 100 comprises a housing 110, an actuator 130, a drive 150 and a sealing element 170.

The actuator 130 comprises a magnetic shape-memory alloy so that a shape change of the actuator 130 can be brought about by a suitable magnetic field. The actuator 130 can be made of the magnetic shape-memory alloy.

Typically, the actuator 130 has a substantially cuboid basic shape with two side faces, two end faces and two faces in which constrictions or indentations are to be formed as cavities. The faces in which cavities are to be formed are also referred to as cavity faces. The surface areas of the cavity faces are larger than the surface areas of the end faces and side faces, preferably the surface areas of the cavity faces are larger than the surface areas of the end faces or side faces at least by the factor of 3.

With respect to one of the cavity faces, a cavity 135 is formed in the actuator 130. Typically, the cavity 135 extends (especially completely) between the side faces of the actuator 130. Between the end faces, the cavity 135 is formed only in sections in the cavity face of the actuator 130. A cavity can also be formed in the cavity face opposite to the viewed cavity face (facing the drive 150).

The actuator 130 is arranged in the housing 110. Specifically, the actuator 130 is arranged in the housing 110 in such a way that all faces of the actuator 130 (cavity faces 131, end faces 132, side faces 133) are enclosed by the housing 110.

The housing 110 comprises a first housing section 120 and a second housing section 125. The first and the second housing sections 120, 125 are connected, for example, by a screw connection to form the housing 110. The housing 110 including the first housing section 120 and the second housing section 125 can also be formed in one piece.

The housing 110, specifically the second housing section 125 comprises a recess 115 into which the actuator 130 can be fitted.

In the housing 110, specifically in the first housing section 120, a groove 117 is provided into which the sealing element 170 is inserted. The course of the groove 117 will be described in greater detail with reference to FIGS. 1b to 1d.

The sealing element 170 has an elastic property. In an area of the cavity face 131 in which no cavity is formed, the sealing element 170 abuts the cavity face 131 of the actuator 130, wherein the sealing element 170 is flush with the lower surface of the first housing section 120, i.e. the sealing element 170 is located completely within the groove 117 and does not protrude from the groove 117. In an area of the cavity face 131 of the actuator 130 in which a cavity 135 is formed, the sealing element 170 also abuts the cavity face 131 of the actuator 130, wherein the sealing element 170 is not flush with the first housing section 120 of the housing 110 in this area, i.e. the sealing element 170 is not located completely within the groove 117, but partially protrudes from the groove 117.

When the cavity 135 moves from one end face to the other end face, the position of the section of the sealing element 170 that protrudes from the groove 117 and abuts the cavity face 131 of the actuator 130 in the area of the cavity 135 is changed.

Due to the design and arrangement of the sealing element 170 in the transport device 100, the cavity 135 is always edge-sealed (towards the side faces) independently of its position (in an area). During the transport, the cavity 135 is delimited by the actuator 130, the sealing element 170 and the housing 110 (specifically by the first housing section 120). When the cavity 135 is formed in an area of the actuator 130 that enables a fluid communication with a fluid inlet 111 arranged in the housing 110, the fluid can flow into the cavity 135 via the fluid inlet 111 and be transported to another position.

Figure 1B:
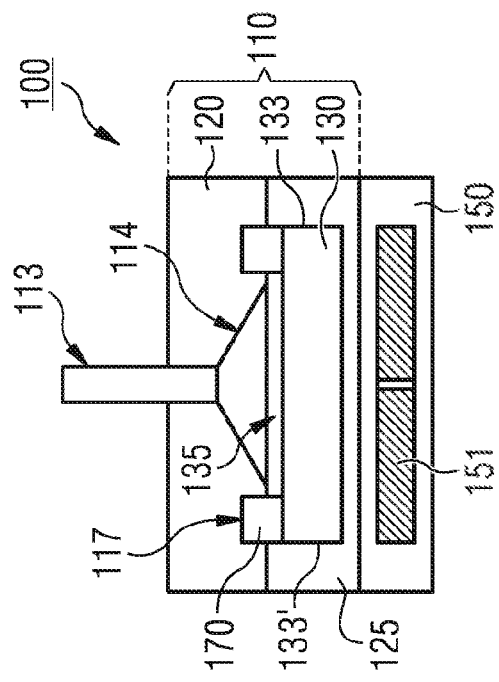
FIG. 1b shows the transport device 100 in a schematic front view.

FIG. 1b shows the transport device 100 in a schematic front view. The transport device 100 comprises a housing 110 including a first housing section 120 and a second housing section 125, an actuator 130, a drive 150 and a sealing element 170. A fluid inlet 111 and a fluid outlet 113 are arranged in the housing.

The fluid inlet 111 is connected to a first diffusor 112 and the fluid outlet 113 is connected to a second diffusor 114. The housing 110, especially the first housing section 120 comprises a groove 117 in which the sealing element is arranged. A cavity 135 is formed in the actuator 130. The drive 150 comprises a plurality of magnets 151 arranged along the longitudinal extension of the actuator. The magnets 151 can be electromagnets and/or permanent magnets. The magnets 151 are preferably arranged along the entire length of the actuator 130.

Due to a change in the magnetic field generated by the magnets 151 along the actuator 130, a movement of the cavity 135 in the actuator 130 is possible. Specifically, the cavity 135 can be moved between the fluid inlet 111 and the fluid outlet 113 so that a fluid can flow into the cavity 135 via the fluid inlet 111 when the cavity 135 is in fluid communication with the fluid inlet 111, the cavity 135 filled with the fluid can be moved towards the fluid outlet 113 and the fluid in the cavity 135 can flow out of the fluid outlet 113 when the cavity 135 is in fluid communication with the fluid outlet 113.

During the movement of the cavity 135 from the fluid inlet 111 to the fluid outlet 113, the . . . cavity is delimited by the actuator 130 (especially the cavity face 131), the housing 110 (especially the first housing section 120) and the sealing element 170 on the edge side and/or end side.

Two clamping elements 126, 127 are arranged in the housing 110, specifically in the second housing section 125. The first clamping element 126 is arranged in the housing 110 in such a way that it contacts at least in sections an end face 132' of the actuator 130 and the second clamping element 127 is arranged in the housing 110 in such a way that it contacts at least in sections another end face 132 of the actuator 130.

When a cavity is formed as a constriction or indentation in the actuator by the drive 150, the actuator 130 expands in another place since the constriction or cavity formation takes place in a volume-stable manner. A restoration of the cavity does not take place without a cause but can be achieved mechanically or magnetically. The clamping elements 126, 127 can have an elastic property so that an increased force is applied to the actuator 130 at the end faces 132, 132' when a cavity 135 is formed in the actuator 130 and the actuator 130 has expanded towards the end faces 132, 132'. By turning off the magnetic field, a force is applied to the actuator 130 by the clamping elements 126, 127 at the end faces 132, 132' so that the cavity 135 is restored. The restoration can also be achieved by a differently oriented magnetic field, e.g. by magnets in the clamping elements 126, 127, wherein the different orientation relates to the orientation of the magnetic field of the drive 150 generated for forming the cavity 135.

Figure 1D:
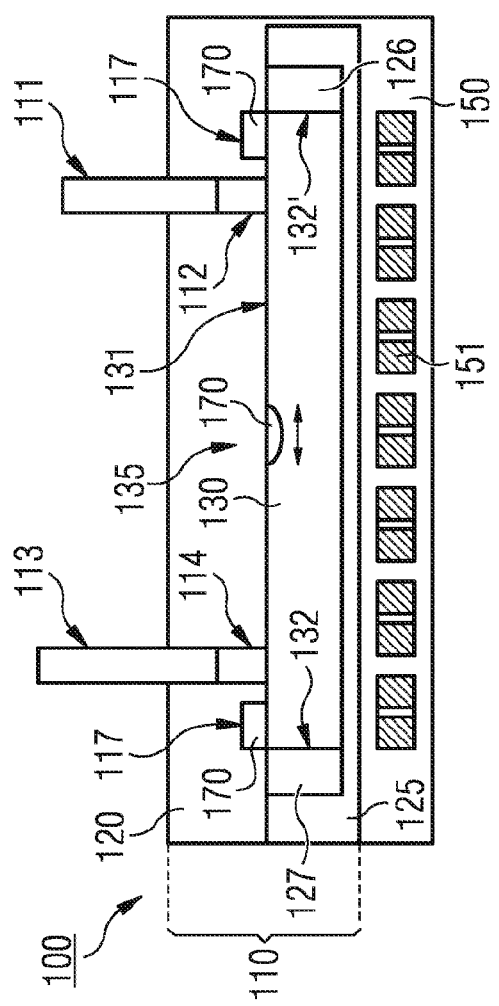
FIG. 1d shows the transport device 100 in a schematic top view.
Figure 1C:
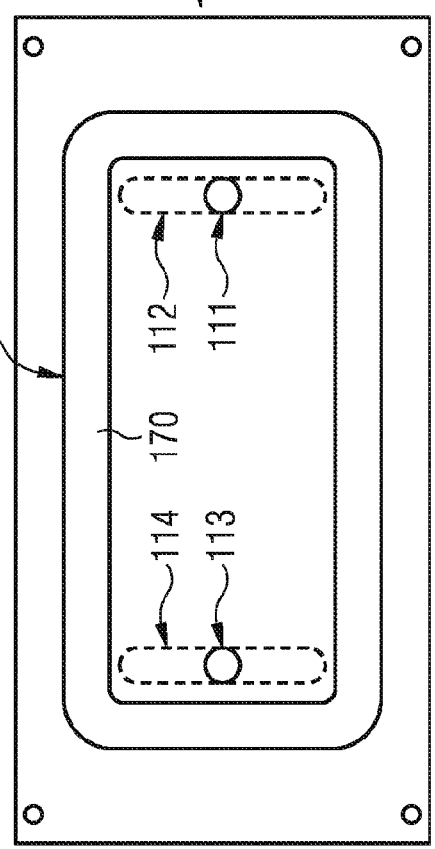
FIG. 1c shows the transport device 100 in a schematic side view.

FIG. 1c shows the transport device 100 in a schematic and sectioned side view.

The fluid outlet 113 is in fluid communication with the second diffusor 114. The cavity 135 in the actuator 130 is in fluid communication with the diffusor 114 and thus also in fluid communication with the fluid outlet 113. The fluid in the cavity 135 can flow out of the transport device 100 via the diffusor 114 and the fluid outlet 113.

At the end of the diffusor facing the actuator 130, the cross-sectional area of the diffusor is larger than the cross-sectional area at the end of the diffusor 114 facing away from the actuator 130.

The first diffusor 112 of the fluid inlet 111 can be identical to the second diffusor 114 of the fluid outlet 113.

The sealing element 170 in the groove 117 protrudes from the groove 117 in order to contact the actuator 130, especially the cavity face 131, since a cavity 135 is present in the actuator 130 of FIG. 1c. The cavity 135 is edge-sealed by the sealing element 170.

In FIG. 1d, the transport device 100 is shown in a schematic top view, wherein the groove 117 is indicated in the housing 110. The sealing element 170 is arranged in the groove 117.

The groove 117 with the sealing element 170 encloses an area or face section of the housing 110, especially of the first housing section 120 in which the fluid can be transported from the fluid inlet 111 via the indicated diffusor 112 to the fluid outlet 113 via the indicated diffusor 114. The cavity 135 is end-sealed by the sealing element 170 in a direction of an axis between the fluid inlet 111 and the fluid outlet 113 and is edge-sealed by the sealing element 170 in a direction of a further axis perpendicular to the first axis. Due to this sealing, a leakage of fluid in a cavity 135 is reduced or even prevented and the hydraulic power of the transport device (pump) is improved.

The basic shapes of the groove 117 and the sealing element 170 substantially correspond to the basic shape of the actuator 130.

The sealing element 170 can have a rectangular ring-like shape, specifically with rounded corners.

In particular, the face or faces of the housing 110 that can come into contact with a fluid, e.g. in the cavity, can be coated with PTFE.

FIGS. 2a to 2d show an embodiment of a transport device 200.

Figure 2A:
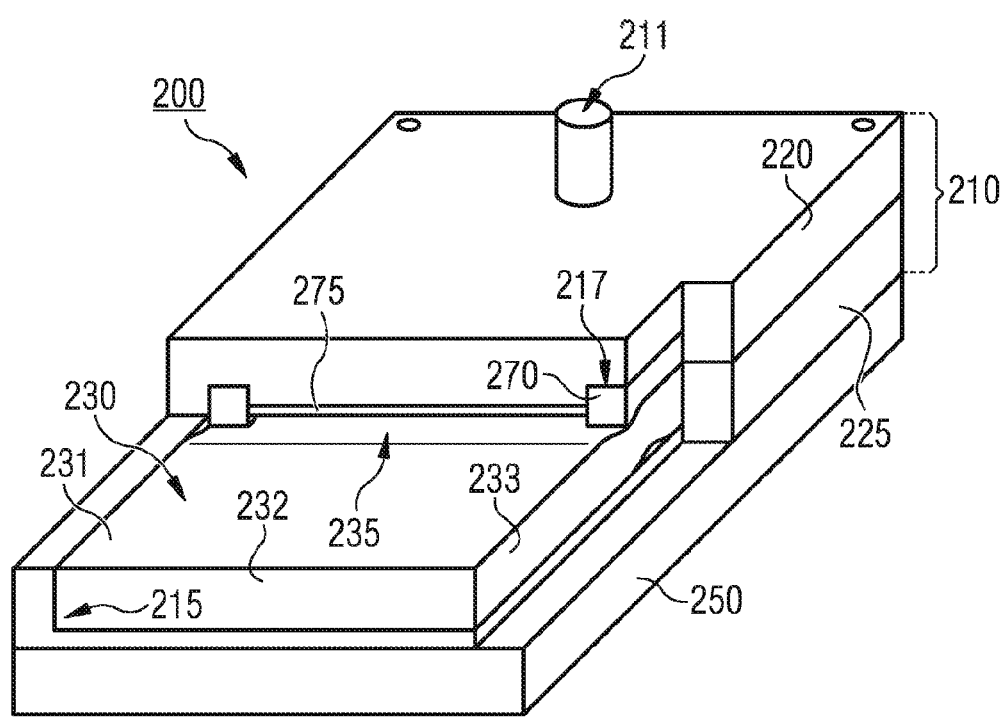
FIG. 2a shows a transport device 200 in a schematic, partially sectioned view.

The transport device 200 can be a pump, more specifically a micro-pump. In FIG. 2a, the transport device 200 is shown in a perspective and schematic view with broken out sections. The transport device 200 comprises a housing 210, an actuator 230, a drive 250, a first sealing element 270 and a second sealing element 275.

The actuator 230 comprises a magnetic shape-memory alloy so that a shape change of the actuator 230 can be brought about by a suitable magnetic field. The actuator 230 can be made of the magnetic shape-memory alloy.

The actuator 230 can have a substantially cuboid basic shape with two side faces, two end faces and two cavity faces in which constrictions or indentations are to be formed as cavities. The surface areas of the cavity faces are larger than the surface areas of the end faces and side faces, preferably the surface areas of the cavity faces are larger than the surface areas of the end faces or side faces at least by the factor of 3.

In one of the cavity faces, a cavity 235 is formed in the actuator 230. Typically, the cavity 235 extends (especially completely) between the side faces of the actuator 230. Between the end faces, the cavity 235 is formed only in sections in the cavity face of the actuator 230.

Typically, a cavity is also formed in the cavity face opposite to the viewed cavity face (facing the drive 250).

The actuator 230 is arranged in the housing 210. Specifically, the actuator 230 is arranged in the housing 210 in such a way that all faces of the actuator 230 (cavity faces 231, end faces 232, side faces 233) are enclosed by the housing 210.

The housing 210 comprises a first housing section 220 and a second housing section 225. The first and the second housing sections 220, 225 are connected, for example, by a screw connection to form the housing 210. The housing 210 including the first housing section 220 and the second housing section 225 can also be formed in one piece.

The housing 210, specifically the second housing section 225 comprises a recess 215 into which the actuator 230 can be fitted.

The housing 210, specifically the first housing section 220 comprises a groove 217. The first sealing element 270 is inserted into said groove.

The first sealing element 270 has an elastic property. In an area of the cavity face 231 in which no cavity is formed, the first sealing element 270 abuts the cavity face 231 of the actuator 230, wherein the sealing element 270 is flush with the second sealing element 275 and a section of the lower surface of the first housing section 220. Thus, the first sealing element 270 does not protrude beyond the extension of the second sealing element 275 towards the actuator 230. In an area of the cavity face 231 of the actuator 230 in which a cavity 235 is formed, the first sealing element 270 also abuts the cavity face 231 of the actuator 230, wherein the first sealing element 270 is not flush with the second sealing element 275 and the first housing section 220 of the housing 210 in this area. Thus, the first sealing element 270 protrudes beyond the extension of the second sealing element 275 (in the same direction) towards the actuator 230.

When the cavity 235 is moved from one end face 232 to the other end face 232' by the drive 250, the position of the section of the first sealing element 270 that protrudes beyond the extension of the second sealing element 275 towards the actuator 230 and abuts the cavity face 231 of the actuator 230 in the area of the cavity 235 is changed.

Due to the design and arrangement of the first sealing element 270 in the transport device 200, the cavity 235 is always edge-sealed (towards the side faces) independently of its position (in an area).

The second sealing element 275 also (in addition to the first sealing element 270) abuts an area of the actuator 230 in which no cavity 235 is formed.

During the transport, the cavity 235 is delimited by the actuator 230 (cavity face 231 of the actuator), the first sealing element 270 and the second sealing element 275. When the cavity 235 is formed in an area of the actuator 230 that enables a fluid communication with a fluid inlet 211 arranged in the housing 210, the fluid can flow into the cavity 235 via the fluid inlet 211 and be transported to another position.

The elastic restoration of the first sealing element 270 can be greater than the elastic restoration of the second sealing element 275 so that the cavity 235 is substantially contacted by the first sealing element 270 only.

The second sealing element 275 can have a planar design. It can be completely enclosed by the first sealing element 270.

The second sealing element 275 can be thinner than the first sealing element 230.

The second sealing element 275 can comprise recesses corresponding to the design of the fluid inlet 211 and the fluid outlet 213, possibly with diffusors 212, 214 connected thereto.

In FIG. 2b, the transport device 200 is shown in a schematic front view. The transport device 200 comprises a housing 210 including a first housing section 220 and a second housing section 225, an actuator 230, a drive 250 and a sealing element 270. The housing 210 comprises a fluid inlet 211 and a fluid outlet 213.

The fluid inlet 211 is connected to a first diffusor 212 and the fluid outlet 213 is connected to a second diffusor 214. The housing 210, especially the first housing section 220 comprises a groove 217 in which the first sealing element 270 is arranged. The second sealing element 275 is arranged at a face of the housing 210, specifically of the first housing section 220 facing the actuator 230. A cavity 235 is formed in the actuator 230. The drive 250 comprises a plurality of magnets 251 arranged along the longitudinal extension of the actuator 230. The magnets 251 can be electromagnets and/or permanent magnets. The magnets 251 are preferably arranged along the entire length of the actuator 230.

The cavity 235 can be moved along the actuator 230 due to a magnetic field generated by the magnets 251. Specifically, the cavity 235 can be moved between the fluid inlet 211 and the fluid outlet 213 so that a fluid can flow into the cavity 235 via the fluid inlet 211 when the cavity 235 is in fluid communication with the fluid inlet 211, the cavity 235 filled with the fluid can be moved towards the fluid outlet 213 and the fluid in the cavity 235 can flow out of the fluid outlet 213 when the cavity 235 is in fluid communication with the fluid outlet 213.

During the movement of the cavity 235 from the fluid inlet 211 to the fluid outlet 213, the cavity is delimited by the actuator 230 (especially the cavity face 231), the second sealing element 275 and the first sealing element 270 on the edge side and/or end side.

Two clamping elements 226, 227 are arranged in the housing 210, specifically in the second housing section 225. The first clamping element 226 is arranged in the housing 210 in such a way that it contacts at least in sections an end face 232' of the actuator 230 and the second clamping element 227 is arranged in the housing 210 in such a way that it contacts at least in sections another end face 232 of the actuator 230.

The clamping elements 226, 227 can have an elastic property so that an increased force is applied to the actuator 230 at the end faces 232, 232' when a cavity 235 is formed in the actuator 230 and the actuator 230 has expanded towards the end faces 232, 232'. By turning off the magnetic field, a force is applied to the actuator 230 by the clamping elements 226, 227 at the end faces 232, 232' so that the cavity 235 is restored. The restoration can also be achieved by a differently oriented magnetic field, e.g. by magnets in the clamping elements 226, 227.

FIG. 2c shows the transport device 200 in a schematic and sectioned side view.

The fluid outlet 213 is in fluid communication with the second diffusor 214. The cavity 235 in the actuator 230 is in fluid communication with the diffusor 214 and thus also in fluid communication with the fluid outlet 213. The fluid in the cavity 235 can flow out of the transport device 200 via the diffusor 214 and the fluid outlet 213.

At the end of the diffusor facing the actuator 230, the cross-sectional area of the diffusor is larger than the cross-sectional area at the end of the diffusor 214 facing away from the actuator 230.

The first diffusor of the fluid inlet 211 can be identical to the second diffusor 214 of the fluid outlet.

The second sealing element 275 comprises recesses that substantially correspond to the shapes of the ends of the diffusors 212, 214 facing the actuator 230.

The first sealing element 270 in the groove 217 protrudes beyond the second sealing element 275 towards the actuator 230 and from the groove 217 in order to contact the actuator 230, especially the cavity face 231, since a cavity 235 is present in the actuator 230 of FIG. 2c. The cavity 235 is edge-sealed by the first sealing element 270.

FIG. 2d shows the transport device 200 in a schematic top view. The groove 217 is indicated in the housing 210. The first sealing element 270 is arranged in the groove 217, the second sealing element 275 abuts the housing 210 in a planar manner (including recesses for the diffusors), wherein the first sealing element 270 especially completely surrounds or encloses the second sealing element 275.

The groove 217 with the first sealing element 270 encloses an area or face section of the housing 210, especially of the first housing section 220 in which the fluid can be transported from the fluid inlet 211 via the indicated diffusor 212 to the fluid outlet 213 via the indicated diffusor 214. The cavity 235 is end-sealed by the first sealing element 270 in a direction of an axis between the fluid inlet 211 and the fluid outlet 213. The cavity 235 is edge-sealed by the first sealing element 270 in a direction of a further axis perpendicular to the first axis. Due to this sealing, a leakage of a fluid in a cavity 235 is reduced or even prevented and the hydraulic power of the transport device (pump) is improved.

The basic shapes of the groove 217 and the first sealing element 270 substantially correspond to the basic shape of the actuator 230.

The first sealing element 270 can have a rectangular ring-like shape, specifically with rounded corners. The second sealing element 275 preferably has a planar design and a rectangular-like basic shape with rounded corners.

In FIGS. 3a to 3d, an embodiment of a transport device 300 is shown. The transport device 300 can be a pump, more specifically a micro-pump.

Figure 3A:
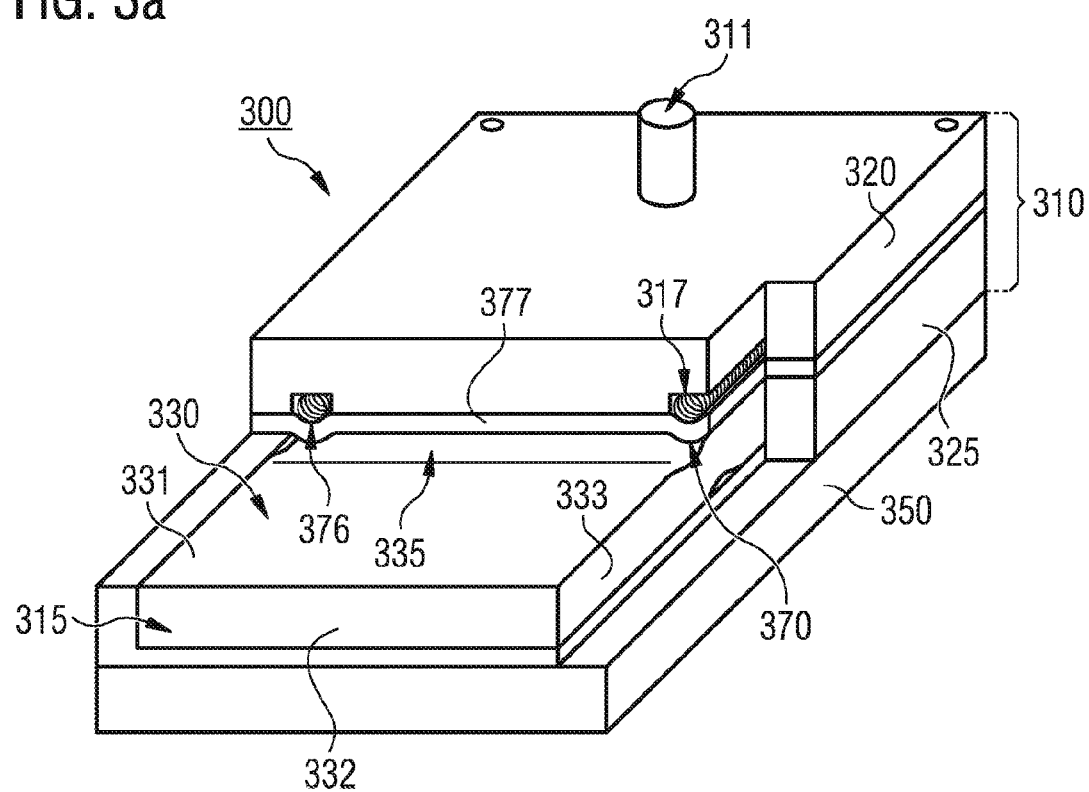
FIG. 3a shows a transport device 300 in a schematic, partially sectioned view.

In FIG. 3a, the transport device 300 is shown in a perspective and schematic view with broken out sections. The transport device 300 comprises a housing 310, an actuator 330, a drive 350 and a sealing element 370. The sealing element 370 comprises a sealing membrane 377 and a spring element 376.

The actuator 330 comprises a magnetic shape-memory alloy so that a shape change of the actuator 330 can be brought about by a suitable magnetic field. The actuator 330 can be made of the magnetic shape-memory alloy.

Typically, the actuator 330 has a substantially cuboid basic shape with two side faces, two end faces and two cavity faces in which constrictions or indentations are to be formed as cavities. The surface areas of the cavity faces are larger than the surface areas of the end faces and side faces, preferably the surface areas of the cavity faces are larger than the surface areas of the end faces or side faces at least by the factor of 3.

With respect to one of the cavity faces, a cavity 335 is formed in the actuator 330. The cavity face opposite to the viewed cavity face can also comprise a cavity. Typically, the cavity 335 extends (especially completely) between the side faces of the actuator 330. Between the end faces, the cavity 335 is formed only in sections in the cavity face of the actuator 330.

The actuator 330 is arranged in the housing 310. Specifically, the actuator 330 is arranged in the housing 310 in such a way that all faces of the actuator 330 (cavity faces 331, end faces 332, side faces 333) are enclosed by the housing 310, possibly in association with the sealing element 370.

The housing 310 comprises a first housing section 320 and a second housing section 325. The first and second housing sections 320, 325 are connected, for example, by a screw connection to form the housing 310. The housing 310 including the first housing section 320 and the second housing section 325 can also be formed in one piece. The sealing membrane 377 of the sealing element 370 is arranged between the first housing section 320 and the second housing section 325.

The housing 310, specifically the second housing section 325 comprises a recess 315 into which the actuator 330 can be fitted.

In the housing 310, specifically in the first housing section 320, a groove 317 is provided into which the spring element 376 of the sealing element 370 is inserted. The course of the groove 317 will be described in greater detail with reference to FIGS. 3b to 3d.

The sealing membrane 377 can have an elastic property. The spring element 376 has an elastic (resilient) property so that the sealing element 370 has an elastic property. The sealing element 370, especially the sealing membrane 377 abuts the cavity face 331 of the actuator 330 in an area of the cavity face 331 in which no cavity is formed, wherein the sealing membrane 377 of the sealing element 370 is planar (does not have a bulge on the surface) and the spring element 376 is located especially completely in the groove 317 and does not protrude from the groove 317. In an area of the cavity face 331 of the actuator 330 in which a cavity 335 is formed, the sealing element 370, especially the sealing membrane 377 also abuts the cavity face 331 of the actuator 330, wherein the sealing membrane 377 is bulged (not planar) in certain areas due to the spring element 376 and the spring element 376 of the sealing element 370 is not located completely in the groove 317 in said area, but partially protrudes from the groove 317 towards the actuator 330 in order to press the sealing membrane 377 in sections into the cavity 335.

When the cavity 335 moves from one end face 332 to the other end face 332', the position of the section of the sealing membrane 377 that is pressed towards the cavity 335 by the spring element 376 and abuts the cavity face 331 of the actuator 330 in the area of the cavity 335 is changed.

Due to the design and arrangement of the sealing element 370 in the transport device 300, the cavity 335 is always edge-sealed (towards the side faces) independently of its position (in an area).

During the transport, the cavity 335 is delimited by the actuator 330 and the sealing element 370 (the sealing membrane 377 of the sealing element 370). When the cavity 335 is formed in an area of the actuator 330 that enables a fluid communication with a fluid inlet 311 arranged in the housing 310, the fluid can flow into the cavity 335 via the fluid inlet 311 and be transported to another position.

FIG. 3b shows the transport device 300 in a schematic front view. The transport device 300 comprises a housing 310 including a first housing section 320 and a second housing section 325, an actuator 330, a drive 350 and a sealing element 370 with a sealing membrane 377 and a spring element 376. A fluid inlet 311 and a fluid outlet 313 are arranged in the housing 310.

The fluid inlet 311 is connected to a first diffusor 312 and the fluid outlet 313 is connected to a second diffusor 314. The housing 310, especially the first housing section 320 comprises a groove 317 in which the sealing element 370, specifically the spring element 376 of the sealing element 370 is arranged. A cavity 335 is formed in the actuator 330. The drive 350 comprises a plurality of magnets 351 arranged along the longitudinal extension of the actuator 330. The magnets 351 can be electromagnets and/or permanent magnets. The magnets 351 are preferably arranged along the entire length of the actuator 330.

Due to a change in the magnetic field generated by the magnets 351 along the actuator 330, a movement of the cavity 335 in the actuator 330 is possible. Specifically, the cavity 335 can be moved between the fluid inlet 311 and the fluid outlet 313 so that a fluid can flow into the cavity 335 via the fluid inlet 311 when the cavity 335 is in fluid communication with the fluid inlet 311, the cavity 335 filled with the fluid can be moved towards the fluid outlet 313 and the fluid in the cavity 335 can flow out of the fluid outlet 313 when the cavity 335 is in fluid communication with the fluid outlet 313.

During the movement of the cavity 335 from the fluid inlet 311 to the fluid outlet 313, the cavity is delimited by the actuator 330 (especially the cavity face 331), the housing 310 (especially the first housing section 320) and the sealing membrane 377 of the sealing element 370 in association with the spring element 376 of the sealing element 370 on the edge side and/or end side.

Two clamping elements 326, 327 are arranged in the housing 310, specifically in the second housing section 325. The first clamping element 326 is arranged in the housing 310 in such a way that it contacts at least in sections an end face 332' of the actuator 330 and the second clamping element 327 is arranged in the housing 310 in such a way that it contacts at least in sections another end face 332 of the actuator 330.

A restoration of the cavity can be achieved mechanically or magnetically. The clamping elements 326, 327 can have an elastic property so that an increased force is applied to the actuator 330 at the end faces 332, 332' when a cavity 335 is formed in the actuator 330 and the actuator 330 expands towards the end faces 332, 332'. By turning off the magnetic field, a force is applied to the actuator 330 by the clamping elements 326, 327 at the end faces 332, 332' so that the cavity 335 is restored. The restoration can also be achieved by a differently oriented magnetic field, e.g. by magnets in the clamping elements 326, 327.

The transport device 300 shown in FIG. 3c in a schematic and sectioned side view comprises the fluid outlet 313 which is in fluid communication with the second diffusor 314. The cavity 335 in the actuator 330 is in fluid communication with the diffusor 314 and thus also in fluid communication with the fluid outlet 313. The fluid in the cavity 335 can flow out of the transport device 300 via the diffusor 314 and the fluid outlet 313.

At the end of the diffusor facing the actuator 330, the cross-sectional area of the diffusor is larger than the cross-sectional area at the end of the diffusor 314 facing away from the actuator 330.

The first diffusor 312 of the fluid inlet 311 can be identical to the second diffusor 314 of the fluid outlet 313.

The sealing element 370 comprises the sealing membrane 377 and the spring element 376. When a cavity 335 is present in the actuator 330 (in an area of the spring element 376), a section of the spring element 376 presses a corresponding section of the sealing membrane 377 towards the cavity 335 so that this section of the sealing membrane 377 abuts the actuator 330 (the cavity face 331 of the actuator 330) and the cavity 335 is edge-sealed by the sealing element 370. The spring element 376 of the sealing element 370 protrudes from the groove 317, in which it is arranged, towards the actuator 330.

Preferably, the sealing membrane 377 is adhesively connected to a section of the housing 310, specifically to the first housing section 320. This can be achieved, for example, by adhesion or a cohesive connection.

The sealing membrane 377 can bridge or close an open side of the groove 317 in which the spring element 376 is arranged. Specifically, the sealing membrane 377 can completely bridge or close an open side of the groove.

In FIG. 3d, the transport device 300 is shown in a schematic top view, wherein the groove 317 is indicated in the housing 310. The spring element 376 of the sealing element 370 is arranged in the groove 317.

The groove 317 with the spring element 376 of the sealing element 370 encloses an area or face section of the housing 310, especially of the first housing section 320 in which the fluid can be transported from the fluid inlet 311 via the indicated diffusor 312 to the fluid outlet 313 via the indicated diffusor 314. The cavity 335 is end-sealed by the sealing element 370, especially the sealing membrane 377 of the sealing element 370 in a direction of an axis between the fluid inlet 311 and the fluid outlet 313, and the cavity 335 is edge-sealed by the sealing element 370, especially the sealing membrane 377 of the sealing element 370 in a direction of a further axis perpendicular to the first axis. Due to this sealing, a leakage of fluid in a cavity 335 is reduced or even prevented and the hydraulic power of the transport device (pump) is improved.

The basic shape of the groove 317 substantially corresponds to the basic shape of the actuator 330.

The spring element 376 of the sealing element 370 can have a rectangular ring-like shape, specifically with rounded corners. The spring element 370 can be continuous, especially can be arranged in the groove 317 across the entire length of the groove 317.

Figure 4:
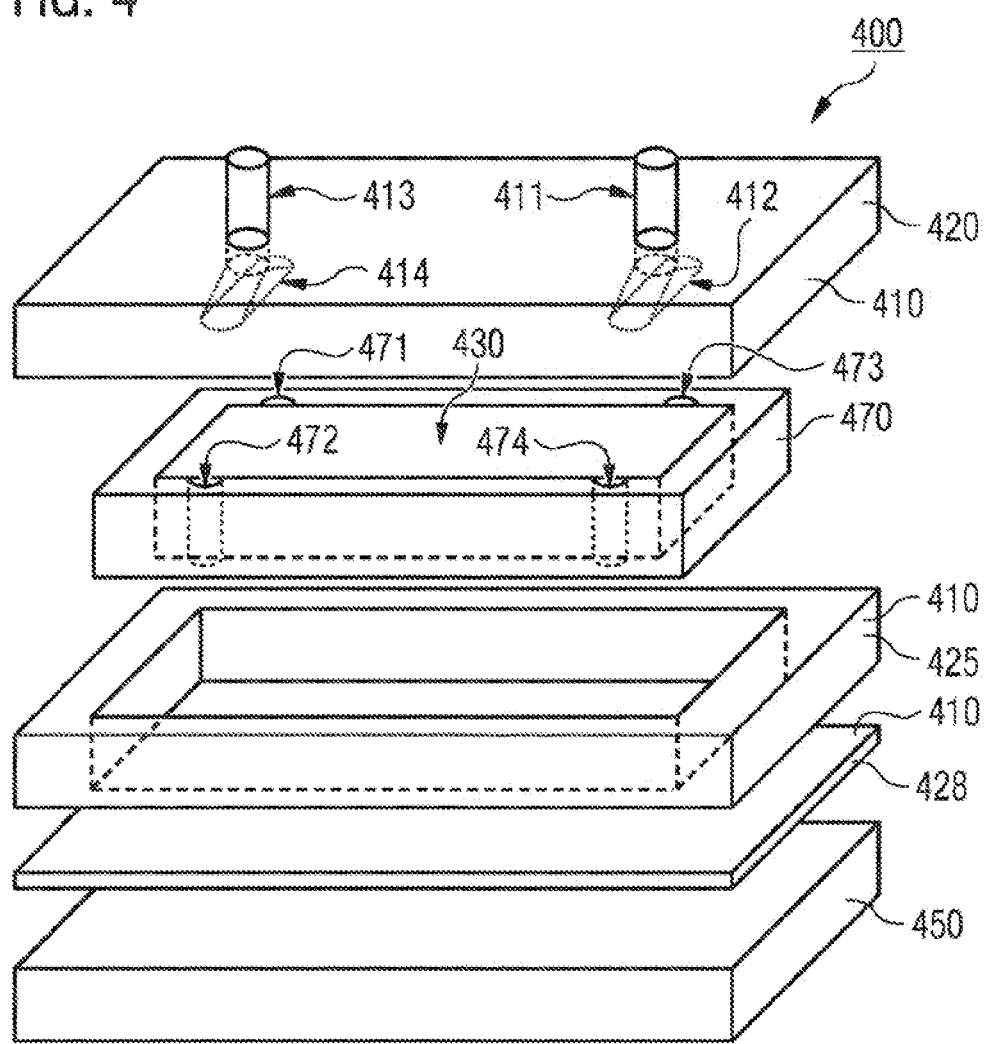
FIG. 4 shows a transport device 400 in an exploded view.

FIG. 4 shows a transport device 400 in an exploded view. The transport device 400 comprises a housing 410, an actuator 430, a drive 450 and sealing element 470.

The housing is divided into three housing sections 420, 425, 428. The three housing sections 420, 425, 428 are separate elements (components) that are not cohesively connected to each other. At least two of the three housing sections 420, 425, 428 can be formed in one piece or be cohesively connected to each other.

The first housing section 420 comprises a fluid inlet 411 with a diffusor 412 connected thereto (indicated in FIG. 4) and a fluid outlet 413 with a diffusor 414 connected thereto (indicated in FIG. 4).

The actuator 430 has a cuboid design and is enclosed by the sealing element 470 in a frame-like manner contacting the end faces and side faces. The second housing section 425 is designed to frame or enclose the sealing element 470 together with the framed actuator 430.

The sealing element 470 comprises four recesses 471, 472, 473, 474 that can extend across the entire height of the sealing element 470. Together with the actuator 430, the recesses 471, 472, 473, 474 form channels connecting a cavity of the lower cavity face of the actuator 430 to a cavity of the upper cavity face of the actuator 430 when the cavities are located in an area matching the recesses 471, 472, 473, 474 (not shown in FIG. 4).

The fluid inlet 411 can be in fluid communication with a cavity in the upper cavity face of the actuator 430 via the diffusor 412. When a cavity of the lower cavity face is in fluid communication with a cavity of the upper cavity face of the actuator 430, e.g. via the recesses 473, 474, a fluid can flow into both cavities via the fluid inlet 411.

Analogously, when the cavities filled with fluid are in communication, e.g. via the recesses 471, 472, the fluid can flow from the fluid outlet 413 via the diffusor 414 out of the device.

The third housing section 428 is preferably thin (thinner than the first housing section 420 or the second housing section 425).

The second housing section 425 is arranged between the first housing section 420 and the third housing section 428.

The three housing sections 420, 425, 428 can be adhered or screwed to each other.

The drive 450 is analogous to the above-described drives.

Figure 5:
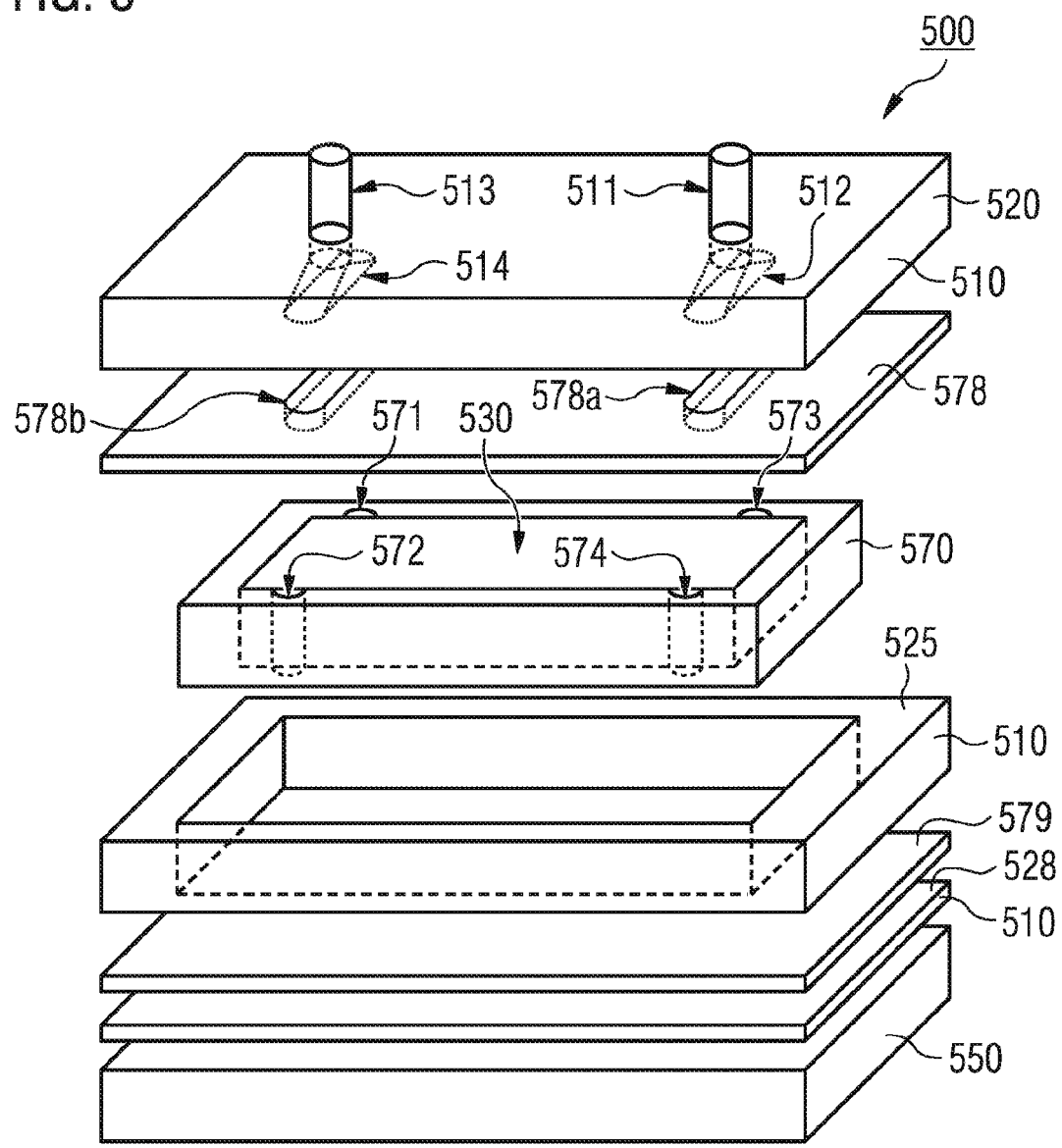
FIG. 5 shows a transport device 500 in an exploded view.

FIG. 5 shows a transport device 500 in an exploded view. The transport device 500 comprises a housing 510, an actuator 530, a drive 550 and a sealing element 570.

These components of the transport device are identical in design to the same components of the transport device 400 so that the description of these components with reference to FIG. 4 also applies to the same components of the transport device 500 according to FIG. 5.

In addition, the transport device 500 comprises a first sealing membrane 578 and a second sealing membrane 579. The first sealing membrane 578 comprises two recesses 578a, 578b. The recesses 578a, 578b are formed and positioned in the first sealing membrane 578 in such a way that they match the shape of the ends of the diffusors 512, 514 facing the actuator 530.

The recess 578a enables fluid to flow into a cavity in the upper cavity face of the actuator 530 via the fluid inlet 511 and the diffusor 512 and fluid is enabled to flow into the cavity of the lower cavity face of the actuator 530 via the recesses 573, 574 in the sealing element 570.

Analogously, the recess 578b enables fluid to flow out of the cavity in the upper cavity face of the actuator 530 and fluid is enabled to flow out of the cavity in the lower cavity face of the actuator 530 via the recesses 571, 572 in the sealing element 570 through the diffusor 514 and the fluid outlet 513.

The first sealing membrane 578 can be arranged between the first housing section 520 and the second housing section 525 especially in such a way that the first housing section 520 does not contact the actuator 530 directly. In addition, the first sealing membrane 578 ensures a sealing of a cavity in the upper cavity face of the actuator 530. The second sealing membrane 579 can be arranged between the second housing section 525 and the third housing section 528. Thus, the actuator 530 cannot contact the third housing section 528 directly and a sealing of a cavity in the lower cavity face of the actuator 530 is ensured.

FIGS. 6a to 6d show an embodiment of a transport device 600. Specifically, the transport device 600 is a pump, more specifically a micro-pump.

Figure 6A:
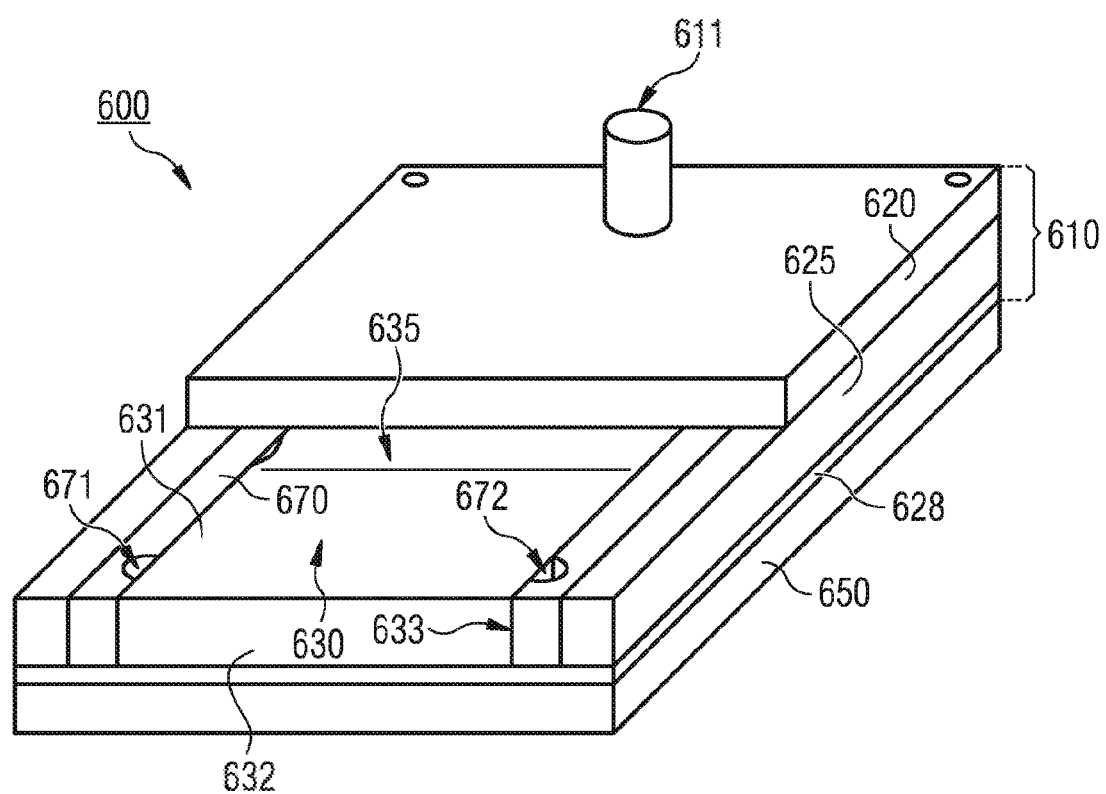
FIG. 6a shows a transport device 600 in a schematic, partially sectioned view.

In FIG. 6a, the transport device 600 is shown in a perspective and schematic view with broken out sections.

The transport device 600 comprises a housing 610, an actuator 630, a drive 650 and a sealing element 670. The actuator 630 comprises a magnetic shape-memory alloy. The shape of the actuator can be changed by a magnetic field provided by the drive 650. The actuator 630 can be made of the magnetic shape-memory alloy.

The actuator 630 has a substantially cuboid basic shape. The actuator 630 comprises two side faces, two end faces and two cavity faces, wherein cavities 635, 635' (only one cavity 635 is shown in FIG. 6a) are to be formed in the cavity faces.

The surface areas of the cavity faces are larger than the surface areas of the end faces and side faces. In particular, the surface areas of the cavity faces can be larger than the surface areas of the end faces or side faces of the actuator 630 at least by the factor of 3.

A cavity 635 extending between the side faces of the actuator 630 is formed in the cavity face 631. The cavity 635 (as well as the cavity 635') is formed in sections in the actuator 630 between the end faces.

The housing 610 comprises a first housing section 620, a second housing section 625 and a third housing section 628. The housing sections 620, 625, 628 are not cohesively connected, but can be connected to each other by a screw connection or by adhesion. At least two of the housing sections 620, 625, 628 can also have a one-piece design.

The housing 610 comprises a fluid inlet 611 which is especially arranged in the first housing section 620 of the housing 610. The third housing section 628 is thinner than the first housing section 620 and/or the second housing section 625. The actuator 630 is arranged in the housing 610. The actuator 630 can be arranged in the housing 610 in such a way that all faces of the actuator 630, i.e. cavity faces 631, end faces 632, side faces 633, are completely enclosed by the housing.

The sealing element 670 comprises recesses 671, 672, 673, 674 (recesses 673 and 674 are not shown in FIG. 6a). Together with the side faces of the actuator 630, the recesses 671, 672, 673, 674 each form a channel. When a cavity 635 is located close to the recesses 671, 672 and a further cavity 635' is located on the face of the actuator 630 opposite to the face with the cavity 635, the cavities 635, 635' are in fluid communication via the recesses 671, 672.

The transport device 600 can comprise sealing membranes 578, 579, as described with reference to FIG. 5.

Figure 6C:
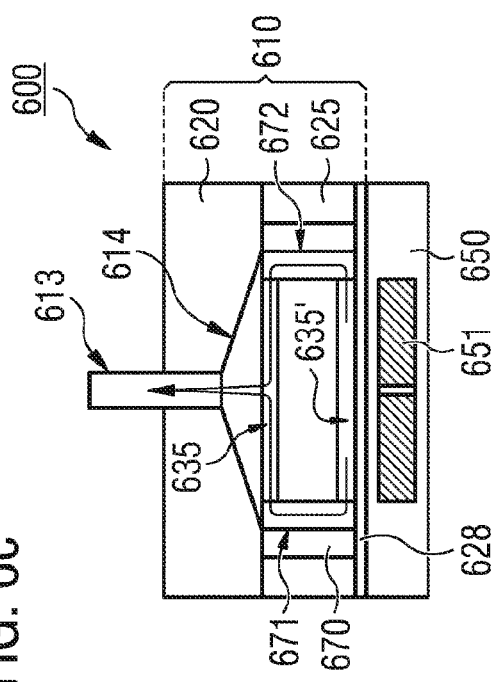
FIG. 6c shows the transport device 600 in a schematic side view.
Figure 6B:
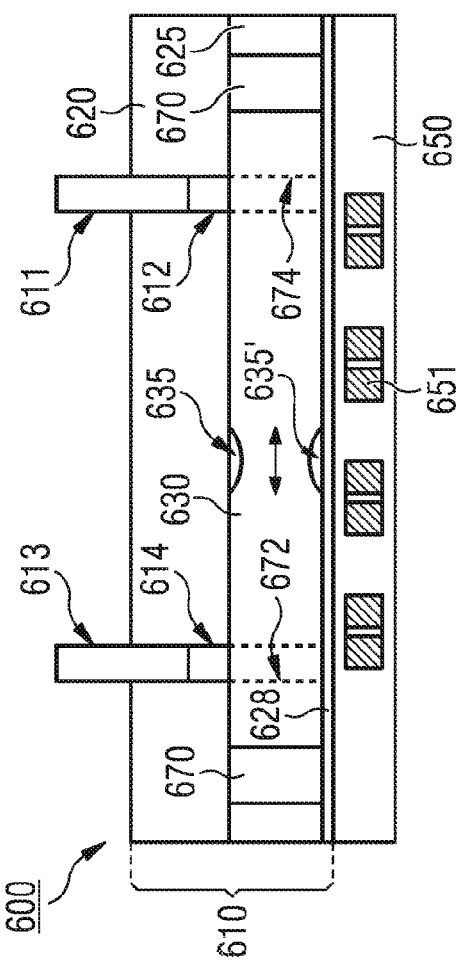
FIG. 6b shows the transport device 600 in a schematic front view.

In FIG. 6b, a transport device 600 is shown in a schematic front view. The transport device 600 comprises a housing 610 including a first housing section 620, a second housing section 625 and a third housing section 628. The transport device 600 further comprises an actuator 630, a drive 650 with a plurality of magnets 651 and a sealing element 670.

The housing 610 comprises a fluid inlet 611 and a diffusor 612 as well as a fluid outlet 613 with a diffusor 614 connected thereto. The sealing element 670 encloses the actuator 630 in a plane, especially in the plane of movement of a cavity 635, 635' in the actuator 630. The sealing element 670 contacts the end faces and the side faces of the actuator 630.

The recesses 672 and 674 (indicated in FIG. 6b) are substantially aligned with the fluid inlet 611 (diffusor 612) or aligned with the outlet 613 (diffusor 614). Thus, when the cavities 635, 635' have moved to a position that enables a fluid communication of the cavity 635 with the diffusor 614 and the fluid outlet 613, it is possible to also ensure a fluid communication of the cavity 635 with the cavity 635' so that fluid can flow out of both cavities 635, 635' from the fluid outlet 613. Analogously, it is ensured that fluid flows into the cavities 635, 635' via the fluid inlet 611 and the diffusor 612.

In FIG. 6c, the transport device 600 is shown in a schematic side view, wherein a fluid communication between the cavity 635', the recess 671, the recess 672, the cavity 635, the diffusor 614 and the fluid outlet 613 is shown in this view.

The sealing element 670 (completely) surrounds the actuator 630 at the side faces thereof.

Figure 6D:
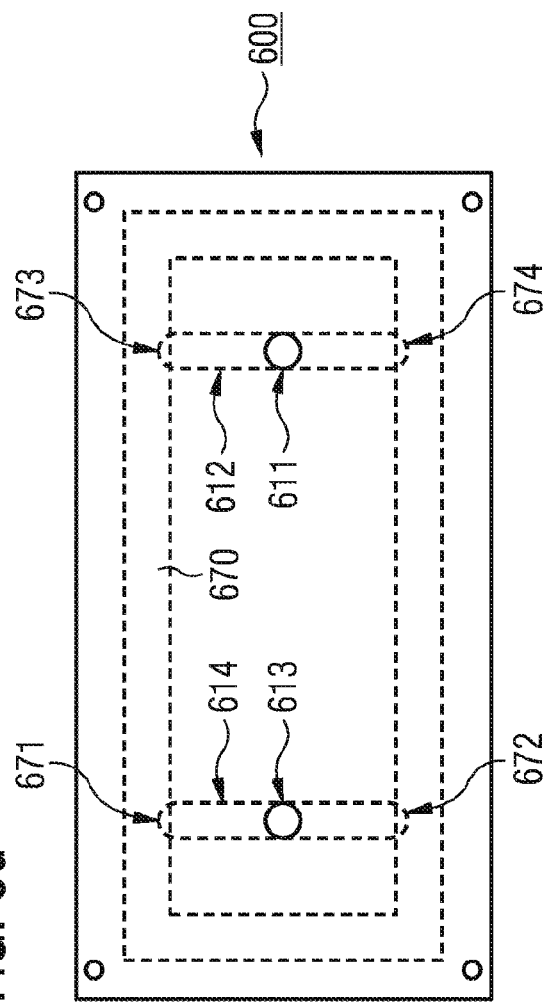
FIG. 6d shows the transport device 600 in a schematic top view.

In FIG. 6d, the transport device 600 is shown in a schematic top view. The fluid inlet 611 is connected to a diffusor 612. The recesses 673, 674 are aligned with the diffusor 612.

The fluid outlet 613 is connected to the diffusor 614. The recesses 671, 672 are aligned with the diffusor 614.

The sealing element 670 completely encloses the actuator 630 (in a plane). Likewise, the diffusors 614, 612 are enclosed by the projected sealing element 670.

The sealing element 670 can have a rectangular ring-like shape.

The face or the faces of the housing 610 that can come into contact with a fluid in one of the cavities 635, 635' is or are preferably coated, especially with a PTFE coating.

Specifically, the face of the first housing section 620 facing the actuator 630 can be provided with such a coating.

The face of the third housing section 628 facing the actuator 630 can also be provided with such a coating.

Figure 7:
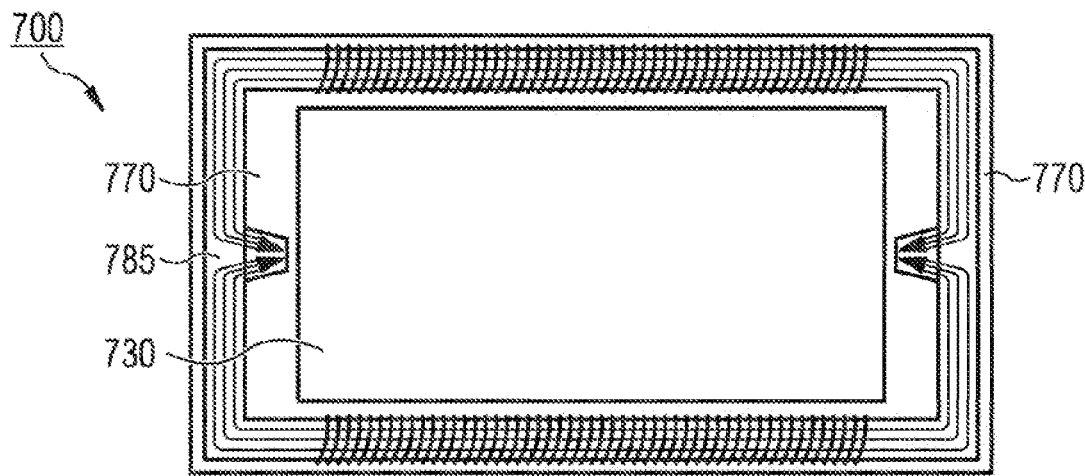
FIG. 7 shows a transport device 700 with a restoring element 785 in a schematic top view.

FIG. 7 shows an actuator 730 and a sealing element 770, wherein the sealing element 770 encloses (surrounds) the actuator.

A restoring element 785 is arranged in the sealing element 770. The restoring element 785 is designed as an electromagnet.

The restoring element 785 serves the purpose of (magnetically) restoring the actuator 730 after a formation of cavities in the actuator 730, as described above.

Figure 8:
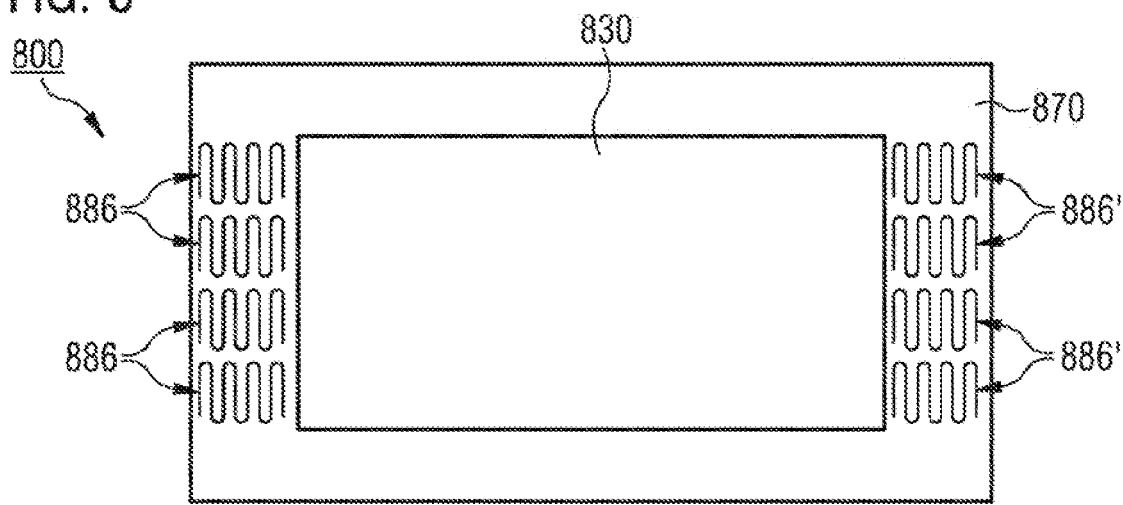
FIG. 8 shows a transport device 800 with a restoring element 886, 886' in a schematic top view.

In FIG. 8, a transport device 800 with an actuator 830 and a sealing element 870 is schematically shown. The sealing element 870 comprises two restoring elements 886, 886'. The restoring elements 886, 886' are arranged in the sealing element 870 and each comprise a plurality of springs, wherein one restoring element 886, 886' each is arranged on opposite sides of the actuator 830 in the sealing element 870. A mechanical restoration of the actuator 830, as described above, is ensured by the springs 886, 886'.

The springs 886, 886' can be metal springs or plastic springs.

Figure 9:
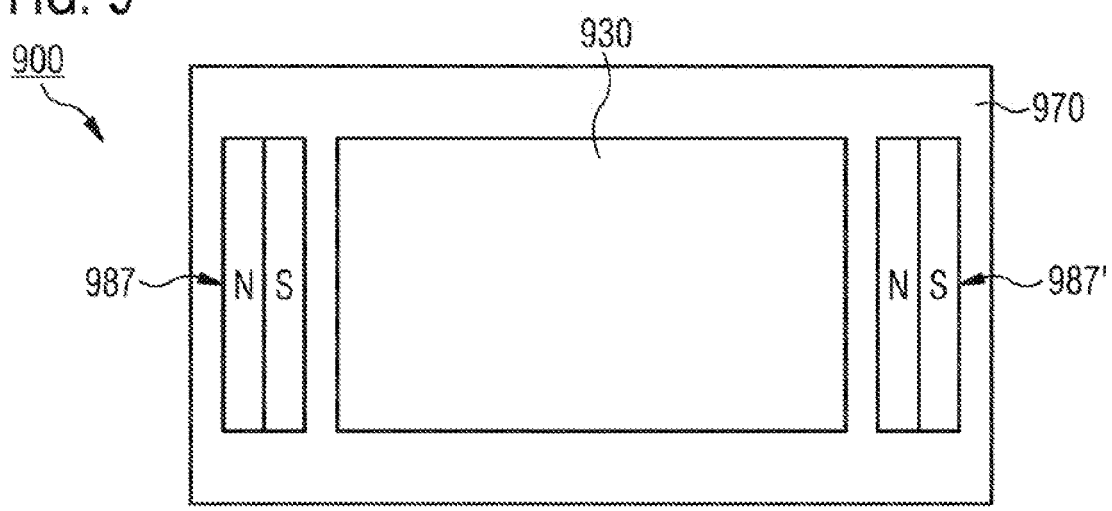
FIG. 9 shows a transport device 900 with a restoring element 987, 987' in a schematic top view.

FIG. 9 (schematically) shows a transport device 900 with an actuator 930 and a sealing element 970 in a top view. Two restoring elements 987, 987' are arranged in the sealing element 970. The restoring elements 987, 987' each comprise a permanent magnet, wherein one restoring element 987, 987' each is arranged on opposite sides of the actuator 930 in the sealing element 970. A magnetic restoration of the actuator 930, as described above, is enabled by the permanent magnets 987, 987'.

FIGS. 10a to 10d show an embodiment of a transport device 1000. The transport device 1000 can be a pump, specifically a micro-pump.

Figure 10A:
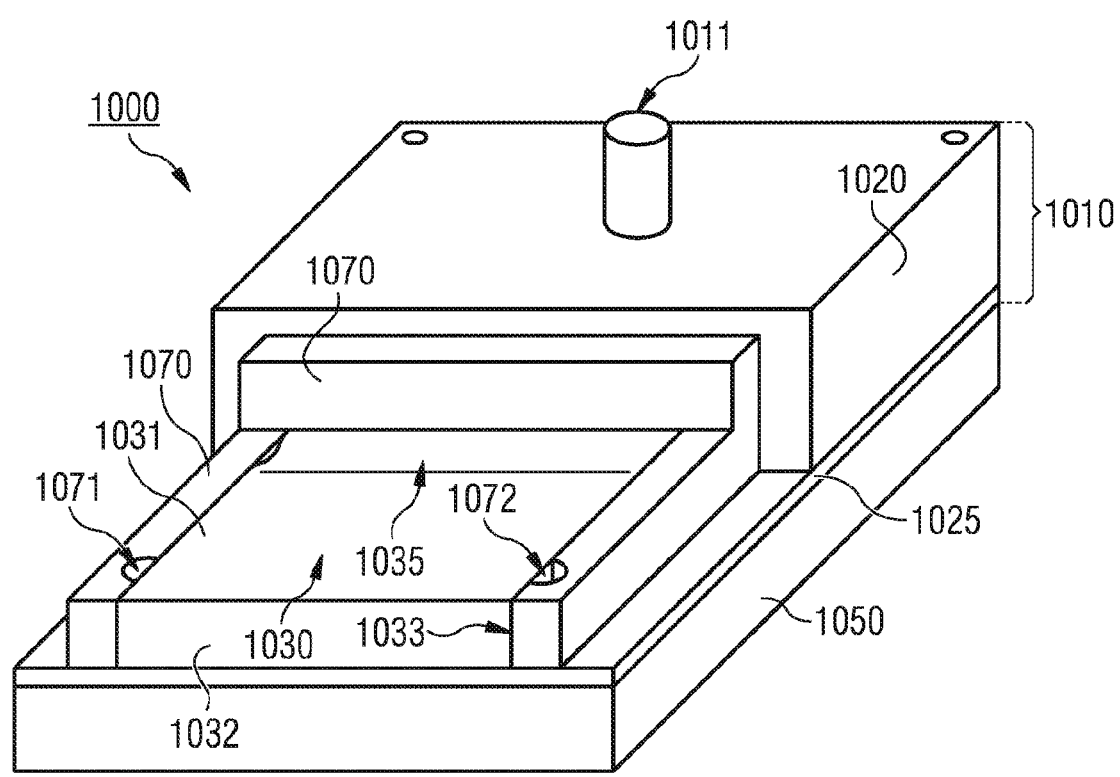
FIG. 10a shows a transport device 1000 in a schematic, partially sectioned view.

In FIG. 10a, the transport device 1000 is shown in a perspective and schematic view with broken out sections.

The transport device 1000 comprises a housing 1010, an actuator 1030, a drive 1050 and a sealing element 1070.

The actuator 1030 comprises a magnetic shape-memory alloy. The shape of the actuator can be changed by a magnetic field provided by the drive 1050. The actuator 1030 can be made of the magnetic shape-memory alloy.

The actuator 1030 has a substantially cuboid basic shape. The actuator 1030 comprises two side faces, two end faces and two cavity faces, wherein cavities 1035, 1035' (only one cavity 1035 is shown in FIG. 10a) are to be formed in the cavity faces.

The surface areas of the cavity faces are larger than the surface areas of the end faces and side faces. In particular, the surface areas of the cavity faces can be larger than the surface areas of the end faces or side faces of the actuator 1030 at least by the factor of 3.

A cavity 1035 extending between the side faces of the actuator 1030 is formed in the cavity face 1031. The cavity 1035 (as well as the cavity 1035') is formed in sections in the actuator 1030 between the end faces 1032.

The housing 1010 comprises a first housing section 1020 and a second housing section 1025. The housing sections 1020, 1025 are not cohesively connected, but can be connected to each other by a screw connection or by adhesion.

The housing 1010 comprises a fluid inlet 1011 which is especially arranged in the first housing section 1020 of the housing 1010. The second housing section 1028 is thinner than the first housing section 1020. The actuator 1030 is arranged in the housing 1010. The actuator 1030 can be arranged in the housing 1010 in such a way that all faces of the actuator 1030, i.e. cavity faces 1031, end faces 1032, side faces 1033, are completely enclosed by the housing 1010.

The sealing element 1070 comprises recesses 1071, 1072, 1073, 1074 (recesses 1073 and 1074 are not shown in FIG. 10a). Together with the side faces of the actuator 1030, the recesses 1071, 1072, 1073, 1074 each form a channel. When a cavity 1035 is located close to the recesses 1071, 1072 and a further cavity 1035' is located on the face of the actuator 1030 opposite to the face with the cavity 1035, the cavities 1035, 1035' are in fluid communication via the recesses 1071, 1072.

The transport device 1000 can comprise a sealing membrane 579 as described with reference to FIG. 5. The sealing membrane 579 can be arranged between the first housing section 1020 and the second housing section 1025.

In FIG. 10b, a transport device 1000 is shown in a schematic front view. The transport device 1000 comprises a housing 1010 including a first housing section 1020 and a second housing section 1025. The transport device 1000 further comprises an actuator 1030, a drive 1050 with a plurality of magnets 1051 and a sealing element 1070.

The housing 1010 comprises a fluid inlet 1011 and a diffusor 1012 as well as a fluid outlet 1013 with a diffusor 1014 connected thereto.

The sealing element 1070 encloses the actuator 1030 in a plane, especially in the plane of movement of a cavity 1035, 1035' in the actuator 1030. In addition, the sealing element 1070 encloses one of the cavity faces 1031 of actuator 1030, especially the cavity face facing the fluid inlet 1011 and/or the fluid outlet 1013.

The sealing element 1070 can contact at least in sections at least five of the six sides of the actuator 1030, please refer also to FIGS. 10a and 10c in this respect.

A section of the fluid inlet 1011 and/or a section of the fluid outlet 1013 are enclosed by the sealing element 1070. The diffusor 1012 of the fluid inlet 1011 and/or the diffusor 1014 of the fluid outlet 1013 can also be enclosed in sections by the sealing element 1070.

The recesses 1072 and 1074 (indicated in FIG. 10b) are substantially aligned with the fluid inlet 1011 (diffusor 1012) or aligned with the outlet 1013 (diffusor 1014). Thus, when the cavities 1035, 1035' have moved to a position that enables a fluid communication of the cavity 1035 with the diffusor 1014 and the fluid outlet 1013, it is possible to also ensure a fluid communication of the cavity 1035 with the cavity 1035' so that fluid can flow out of both cavities 1035, 1035' from the fluid outlet 1013. Analogously, it is ensured that fluid flows into the cavities 1035, 1035' via the fluid inlet 1011 and the diffusor 1012.

In FIG. 10c, the transport device 1000 is shown in a schematic side view, wherein a fluid communication between the cavity 1035', the recess 1071, the recess 1072, the cavity 1035, the diffusor 1014 and the fluid outlet 1013 is shown in this view.

The sealing element 1070 (completely) surrounds the actuator 1030 at the side faces thereof and encloses the cavity face 1031 of the actuator 1030 facing the fluid inlet 1011 and/or the fluid outlet 1013. Preferably, the sealing element 1070 does (substantially) not contact the cavity face of the actuator 1030 facing the drive 1050.

In FIG. 10d, the transport device 1000 is shown in a schematic top view. The fluid inlet 1011 is connected to a diffusor 1012. The recesses 1073, 1074 are aligned with the diffusor 1012.

The fluid outlet 1013 is connected to the diffusor 1014. The recesses 1071, 1072 are aligned with the diffusor 1014.

The sealing element 1070 completely encloses the actuator 1030 (in a plane). Likewise, the diffusors 1014, 1012 are enclosed by the projected sealing element 1070.

The face or the faces of the housing 1010 that can come into contact with a fluid in one of the cavities 1035, 1035' is or are preferably coated, especially with a PTFE coating.

Specifically, the face of the first housing section 1020 facing the actuator 1030 can be provided with such a coating.

The face of the second housing section 1025 facing the actuator 1030 can also be provided with such a coating.

FIGS. 11a to 11d show an embodiment of a transport device 1100. Specifically, the transport device 1100 is a pump, more specifically a micro-pump.

Figure 11A:
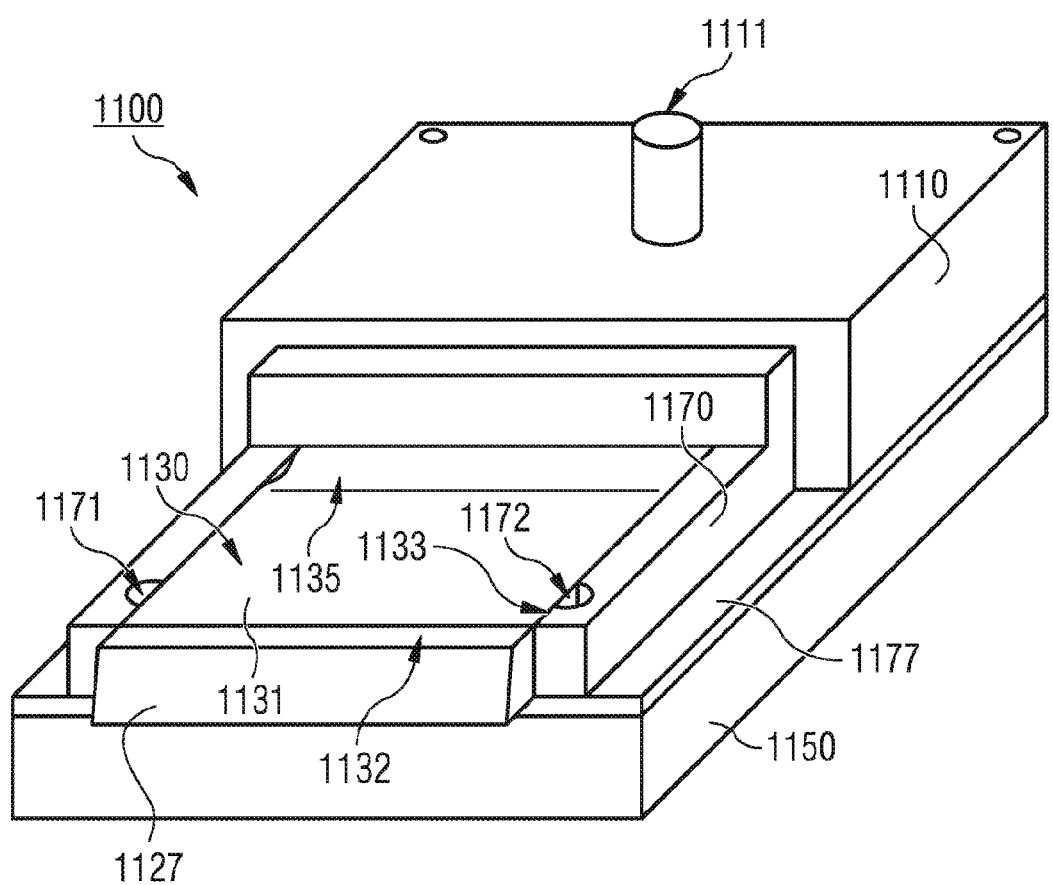
FIG. 11a shows a transport device 1100 in a schematic, partially sectioned view.

In FIG. 11a, the transport device 1100 is shown in a perspective and schematic view with broken out sections.

The transport device 1100 comprises a housing 1110, an actuator 1130, a drive 1150 and a sealing element 1170. The actuator 1130 comprises a magnetic shape-memory alloy. The shape of the actuator can be changed by a magnetic field provided by the drive 1150. The actuator 1130 can be made of the magnetic shape-memory alloy.

The actuator 1130 has a substantially cuboid basic shape. The actuator 1130 comprises two side faces, two end faces and two cavity faces, wherein cavities 1135, 1135' (only one cavity 1135 is shown in FIG. 11a) are to be formed in the cavity faces.

The surface areas of the cavity faces are larger than the surface areas of the end faces and side faces. In particular, the surface areas of the cavity faces can be larger than the surface areas of the end faces or side faces of the actuator 1130 at least by the factor of 3.

A cavity 1135 extending between the side faces of the actuator 1130 is formed in the cavity face 1131. The cavity 1135 (as well as the cavity 1135') is formed in sections in the actuator 1130 between the end faces.

The housing 1110 comprises a fluid inlet 1111 and a fluid outlet 1113. The actuator 1130 can be arranged in the housing 1110 in such a way that the end faces 1132, side faces 1133 and at least one of the cavity faces 1131 are enclosed by the housing 1110.

The sealing element 1170 comprises recesses 1171, 1172, 1173, 1174 (recesses 1173 and 1174 are not shown in FIG. 11a). Together with the side faces of the actuator 1130, the recesses 1171, 1172, 1173, 1174 each form a channel. When a cavity 1135 is located close to the recesses 1171, 1172 and a further cavity 1135' is located on the face of the actuator 1130 opposite to the face with the cavity 1135, the cavities 1135, 1135' are in fluid communication via the recesses 1171, 1172.

The transport device 1100 comprises a sealing membrane 1177 which is arranged between the actuator 1130 and the drive 1150.

The transport device 1100 comprises two clamping elements 1126, 1127, wherein one clamping element 1126, 1127 each contacts a side of the actuator 1130, especially an end face 1132 thereof. The clamping elements 1126, 1127 can extend across the entire length of the respective contacted side or face of the actuator 1130.

The clamping elements 1126, 1127 have a trapezoidal basic shape. At least one side of the clamping elements 1126, 1127 each has a respective trapezoidal design.

The clamping elements 1126, 1127 can contact the sealing element 1170, the housing 1110, the actuator 1130 and/or the sealing membrane 1177.

The clamping elements 1126, 1127 can be made of a non-compressible material.

In FIG. 11b, a transport device 1100 is shown in a schematic front view. The transport device 1100 comprises a housing 1110, an actuator 1130, a drive 1150 with a plurality of magnets 1151 and a sealing element 1170.

The housing 1110 comprises a fluid inlet 1111 and a diffusor 1112 as well as a fluid outlet 1113 with a diffusor 1114 connected thereto. The sealing element 1170 surrounds one of the cavity faces 1131 and at least one of the side faces 1133, specifically both side faces 1133.

The recesses 1172 and 1174 (indicated in FIG. 11b) are substantially aligned with the fluid inlet 1111 (diffusor 1112) or aligned with the outlet 1113 (diffusor 1114). Thus, when the cavities 1135, 1135' have moved to a position that enables a fluid communication of the cavity 1135 with the diffusor 1114 and the fluid outlet 1113, it is possible to also ensure a fluid communication of the cavity 1135 with the cavity 1135' so that fluid can flow out of both cavities 1135, 1135' from the fluid outlet 1113. Analogously, it is ensured that fluid flows into the cavities 1135, 1135' via the fluid inlet 1111 and the diffusor 1112.

One of the clamping elements 1126, 1127 contacts one of the end faces of the actuator 1130 in each case.

In FIG. 11c, the transport device 1100 is shown in a schematic side view, wherein a fluid communication between the cavity 1135', the recess 1171, the recess 1172, the cavity 1135, the diffusor 1114 and the fluid outlet 1113 is shown in this view.

In FIG. 11d, the transport device 1100 is shown in a schematic top view. The fluid inlet 1111 is connected to a diffusor 1112. The recesses 1173, 1174 are aligned with the diffusor 1112.

The fluid outlet 1113 is connected to the diffusor 1114. The recesses 1171, 1172 are aligned with the diffusor 1114.

Figure 12A:
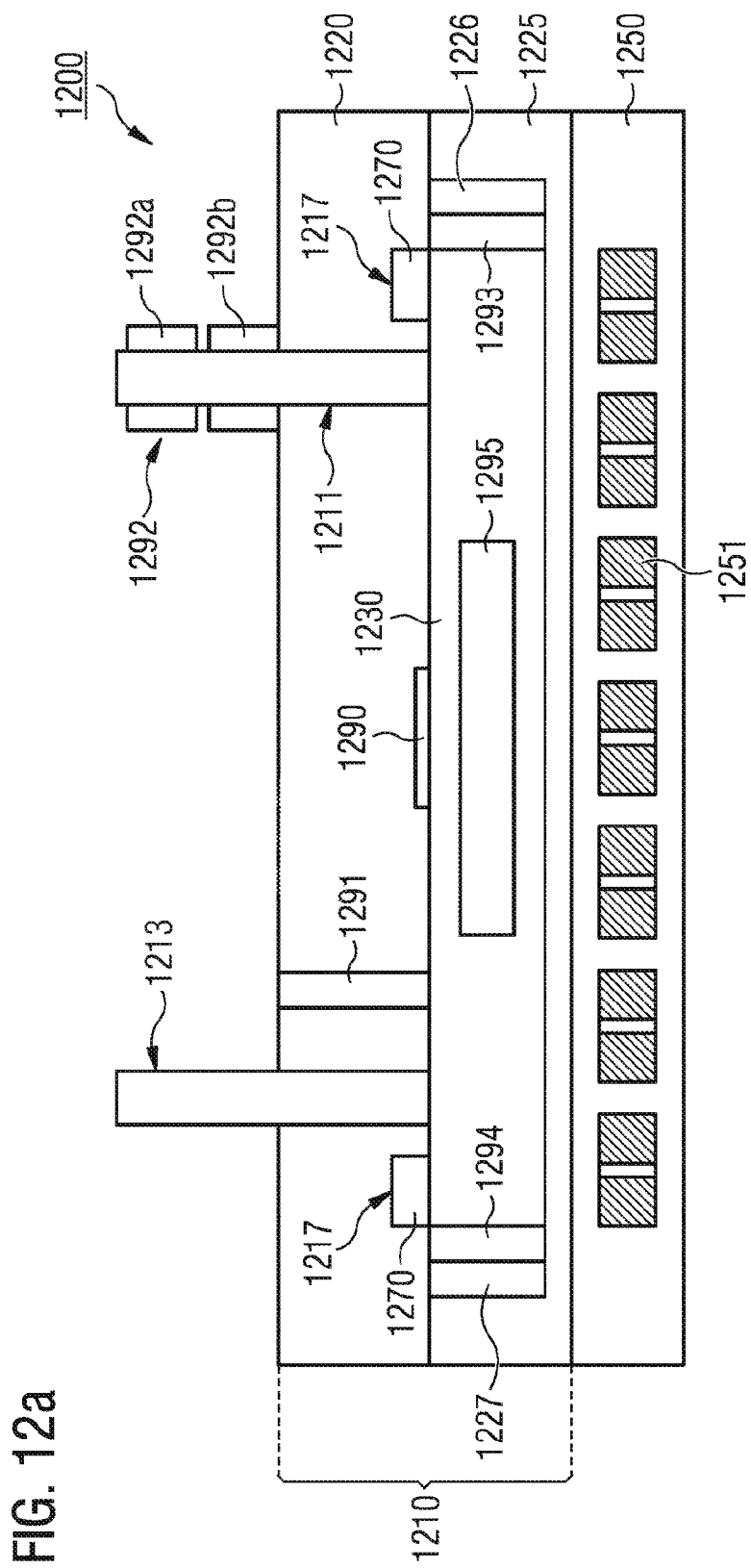
FIG. 12a shows a transport device 1200 with sensors 1290, 1291, 1292, 1293, 1294, 1295 in a schematic front view.
Figure 12B:
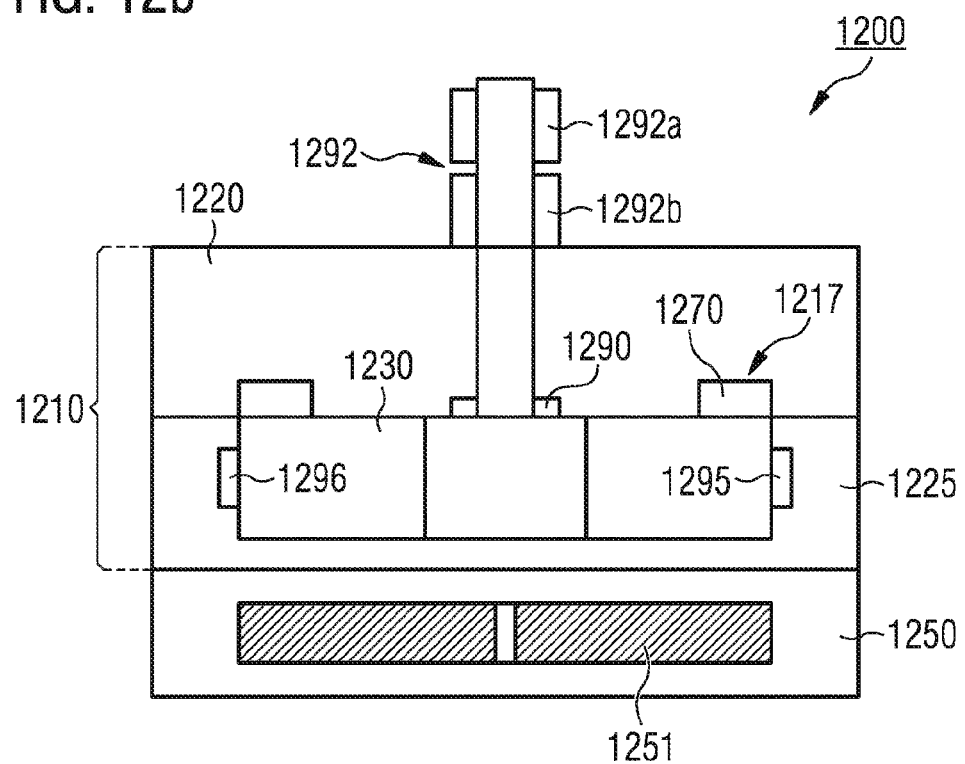
FIG. 12b shows the transport device 1200 with sensors 1290, 1292, 1295 in a schematic side view.

By way of example, a transport device 1200 with sensors 1290, 1291, 1292, 1293, 1294, 1295, 1296 is shown in FIGS. 12a and 12b.

The features of the sensor arrangement 1290, . . . described with respect to the transport device 1200 can be integrated into any one of the transport devices 100, . . . described herein.

The transport device 1200 comprises a housing 1210 including especially a first housing section 1220 and a second housing section 1225. The transport device 1200 further comprises an actuator 1230, a drive 1250 especially with a plurality of magnets 1251 and a sealing element 1270 which is specifically arranged in a groove 1217 of the housing 1210.

The sensor arrangement of the transport device 1200 comprises an optical sensor 1291. The optical sensor 1291 is arranged in the housing 1210 and leads through the housing. One end of the optical sensor 1291 is arranged in the housing in such a way that a face (especially a cavity face) of the actuator 1230 can be optically detected by the sensor 1291.

This end can be an end of an optical fiber, at the other end of which an evaluation unit or analysis unit of the optical sensor 1291 is arranged.

A face (cavity face) of the actuator can be optically measured by the optical sensor 1291. Specifically, a cavity in the actuator 1230 can be detected by the optical sensor 1291. This can be achieved with respect to the geometrical properties of the cavity in the actuator 1230 and with respect to the frequency of the occurrence of cavities in the actuator 1230.

The sensor arrangement of the transport device 1200 can also comprise a pressure sensor 1292. The pressure sensor 1292 is arranged at least in part at the fluid inlet 1211 and can measure the absolute pressure in the fluid inlet 1211.

When a cavity is formed in the actuator 1230 which is in fluid communication with the fluid inlet 1211, a negative pressure is created, whereby a fluid can flow into the cavity of the actuator 1230 via the fluid inlet 1211. This pressure in the fluid inlet 1211 can be measured by the pressure sensor 1292.

The pressure sensor 1292 (also differential pressure sensor) can comprise a first pressure sensor 1292a and a second pressure sensor 1292b so that a differential pressure between the fluid inlet 1211 and the fluid outlet 1213 can be determined. For this purpose, two pressure sensors 1292a, 1292b can be arranged before the fluid inlet 1211 or two pressure sensors can be arranged after the fluid outlet 1213 (not shown completely in FIGS. 12a and 12b).

The operation of the transport device 1200 can be monitored by using the data of the pressure sensor 1292, and the operation of the transport device 1200 can be controlled or regulated based on the data of the pressure sensor 1292.

A temperature sensor 1290 is arranged in the transport device 1200 in such a way that the temperature of the actuator 1230 can be detected by the temperature sensor 1290. In particular, the temperature sensor 1290 is arranged (in part) in the housing 1210 of the transport device 1200. The temperature sensor 1290 can contact a face of the actuator 1230.

The data of the temperature sensor 1290 can be used to monitor, control or regulate the operation of the transport device 1200.

In particular, the operation of the transport device 1200 is adjusted (controlled or regulated) in such a way that the temperature of the actuator 1230 will not exceed a value of 100° C., specifically not exceed a temperature of 55° C. The temperature of the actuator 1230 can be adjusted, for example, via a heating and/or cooling element (which is not shown in FIGS. 12a and 12b), e.g. a Peltier element.

Piezo sensors 1293, 1294 can detect an expansion of the actuator 1230 (force effect of the actuator 1230) in a direction of cavity movements between the fluid inlet 1211 and the fluid outlet 1213. Piezo sensors 1293, 1294 can be arranged on end faces of the actuator 1230. One piezo sensor 1293, 1294 can be provided on one end face of the actuator 1230.

The piezo sensors 1293, 1294 can contact one end face of the actuator 1230 and especially contact one clamping element 1226, 1227 in each case.

The data of the piezo sensors 1293, 1294 can be used to monitor, control or regulate the operation of the transport device 1200. The size and/or frequency of the value measured by the piezo sensors is indicative of the volume flow transported by the transport device 1200 and/or an aging of the actuator 1230.

Strain gauges 1295, 1296 are also indicative of the volume flow conveyed by the transport device 1200 and/or an aging of the actuator 1230. Strain gauges 1295, 1296 can be arranged in the housing 1210. The strain gauges 1295, 1296 can each contact a side face of the actuator 1230. A strain gauge 1295, 1296 can also be arranged on a side face of the actuator 1230 and contact the same.

Data of the strain gauges 1295, 1296 enable a monitoring, control or regulation of the operation of the transport device 1200.

FIGS. 13a and 13b show an actuator 1330 including a separation layer 1380.

Each one of the actuators 130, . . . , 1330 described herein can comprise a separation layer 1380.

In FIG. 13a, no cavity is formed in the actuator 1330. The separation layer 1380 encloses all sides of the actuator 1330, wherein also at least one side of the actuator 1330 can be enclosed by the separation layer 1380.

The separation layer 1380 comprises a first film element 1381 and a second film element 1382. The film elements 1381, 1382 are connected airtight by a weld 1398.

The separation layer 1380 can comprise a one-piece film element. Specifically, a tube-shaped film element can be placed around the actuator 1330 and the open sides or the open side of the film element can be welded (airtight) so that the actuator 1330 is especially completely enclosed by the film element.

The separation layer 1380 comprises a valve 1399. A pressure outside of the separation layer 1380 (surrounding the separation layer 1380) and a pressure between the separation layer 1380 and the actuator 1330 can be adjusted via the valve 1399. For example, the film elements 1381, 1382 or a one-piece film can be laid around the actuator 1330 so that air between the actuator 1330 and the film can be sucked or pressed through the valve 1399.

Thus, the film rests tightly against the actuator 1330 and the pressure between the actuator 1330 and the separation layer 1380 is reduced as compared to the surroundings. The film elements 1381, 1382 (or a one-piece film) can be welded to each other so that the negative pressure between the actuator 1330 and the separation layer 1380 is maintained.

In FIG. 13b, cavities 1335, 1335' are formed in the actuator 1330, one cavity 1335, 1335' each in one of the cavity faces of the actuator 1330. The separation layer 1380 follows the constriction of the actuator 1330 in order to form a cavity 1335, 1335'.

When a fluid is transported in a cavity 1335, 1335' (as described above), the fluid does not contact the actuator 1330 directly, but the separation layer 1380. Thus, even aggressive or sensible fluids can be transported in a transport device 100, . . . comprising the actuator 1330 with the separation layer 1380. Specifically, biocompatibility of such a transport device 100, . . . is ensured.

The thickness sB of the separation layer 1380 can be less than the maximum depth sK of the cavity 1335 that can be formed in the actuator 1330.

Besides the separation layer 1380 described with respect to FIGS. 13a and 13b, the separation layer 1380 can be designed as a coating that is connected to the actuator 1330 in a firmly adhering manner.

The invention claimed is:

1. A transport device for transporting a fluid, the transport device comprising:
 (a) a housing, wherein the housing has a fluid inlet and a fluid outlet;
 (b) an actuator comprising a magnetic shape-memory alloy, wherein the actuator is at least partially arranged in the housing;
 (c) a drive by which the actuator may be deformed in such a way that at least one cavity for the fluid is formed in the actuator, wherein the at least one cavity may be moved by the drive in order to transport the fluid in the at least one cavity from the fluid inlet to the fluid outlet;
 (d) wherein at least one section of the actuator has a separation layer by which a direct contact between the fluid and the actuator is prevented in said section of the actuator;
 (e) wherein the transport device further comprises a sealing element, wherein at least one section of the sealing element has an elastic property so that a section of the sealing element sealingly abuts against a section of the at least one cavity of the actuator when the at least one cavity is formed in the actuator by the drive.

2. The device according to claim 1, wherein the separation layer extends across an entire side of the actuator.

3. The device according to claim 1, wherein at least 80% of the total surface of the actuator is covered by the separation layer.

4. The device according to claim 1, wherein a thickness of the separation layer is less than a maximum depth of the at least one cavity.

5. The device according to claim 1, wherein the separation layer is a film.

6. The device according to claim 5, wherein a negative pressure prevails between the film and the actuator as compared to the surroundings of the film.

7. The device according to claim 5, wherein the film comprises a valve.

8. The device according to claim 5, wherein the film has a weld.

9. The device according to claim 5, wherein a liquid is present between the film and the actuator.

10. The device according to claim 1, wherein the separation layer is a coating.

11. The device according to claim 10, wherein the coating comprises a parylene.

12. The device according to claim 10, wherein the coating is applied to the actuator by chemical vapor deposition, physical vapor deposition, cathode evaporation or resublimation.

13. The device according to claim 1, wherein an adhesion-promoting agent is applied between the actuator and the separation layer.

14. The device according to claim 1, wherein the sealing element is designed and arranged between the actuator and the housing in such a way that the cavity is edge-sealed or end-sealed during the transport of the fluid from the fluid inlet to the fluid outlet.

15. The device according to claim 1, wherein the housing has a groove in which at least one section of the sealing element is arranged.

16. The device according to claim 15, wherein the groove surrounds or encloses a face section of the housing.

17. The device according to claim 1, wherein the face section of the housing surrounded or enclosed by the groove comprises the fluid inlet and/or the fluid outlet.

18. The device according to claim 1, wherein the actuator may be deformed by the drive in such a way that two cavities for the fluid are formed in the actuator, wherein the two cavities may be moved by the drive in order to transport the fluid in the two cavities from the fluid inlet to the fluid outlet, and wherein the the sealing element has at least one recess, and wherein the sealing element is arranged in the housing in such a way that the two cavities are at least temporarily in fluid communication via the recess during the transport of the fluid from the fluid inlet to the fluid outlet.

19. The device according to claim 18, wherein the actuator may be deformed in such a way that the two cavities are formed on opposite sides of the actuator.

20. The device according to claim 18, wherein the sealing element contacts at least partially at least two different sides of the actuator.

21. The device according to claim 18, wherein the housing has an upper side which is substantially in parallel with a side of the actuator in which a major part of one of the two cavities is formed, and wherein the fluid inlet and/or the fluid outlet protrude from the upper side of the housing, or the fluid inlet and/or the fluid outlet protrude from a side of the housing that is lateral to the upper side of the housing.

22. The device according to claim 18, comprising a first sealing membrane and a second sealing membrane, wherein the first sealing membrane contacts a side of the actuator and the second sealing membrane contacts another side of the actuator.

23. The device according to claim 1, wherein the housing comprises at least one diffusor.

24. The device according to claim 23, wherein a diffusor is connected to the fluid inlet and a diffusor is connected to the fluid outlet, and wherein in each case a side of each diffusor that is closer to the actuator has a larger cross-sectional area than a side of each diffusor that is more remote from the actuator.

25. The device according to claim 1, wherein the sealing element comprises an elastomer and/or a foam material.

26. The device according to claim 1, wherein the housing comprises a metal or a plastic material.

27. The device according to claim 1, wherein the housing delimits each at least one cavity and has at least in sections a PTFE coating.

28. The device according to claim 1, wherein at least two cavities may be formed simultaneously in the same face of the actuator.

29. The device according to claim 1, comprising a temperature sensor by which a temperature of the actuator may be detected.

30. The device according to claim 1, comprising an optical sensor by which the presence of a cavity in the actuator may be detected.

31. The device according to claim 1, comprising a pressure sensor by which a pressure at the fluid inlet or at the fluid outlet may be detected.

32. A transport device for transporting a fluid, the transport device comprising:
 (a) a housing, wherein the housing has a fluid inlet and a fluid outlet;
 (b) an actuator comprising a magnetic shape-memory alloy, wherein the actuator is at least partially arranged in the housing;
 (c) a drive, by which the actuator may be deformed in such a way that at least one cavity for the fluid is formed in the actuator, wherein the at least one cavity may be moved by the drive in order to transport the fluid in the at least one cavity from the fluid inlet to the fluid outlet;
 (d) wherein at least one section of the actuator has a separation layer by which a direct contact between the fluid and the actuator is prevented in said section of the actuator;
 (e) wherein the separation layer is a film; and
 (f) wherein:
  (i) a negative pressure prevails between the film and the actuator as compared to the surroundings of the film,
  (ii) the film comprises a valve,
  (iii) the film has a weld,
  (iv) a liquid is present between the film and the actuator, or
  (v) a combination thereof.

33. A transport device for transporting a fluid, the transport device comprising:
 (a) a housing, wherein the housing has a fluid inlet and a fluid outlet, a longitudinal axis being defined in a direction from the inlet to the outlet;
 (b) an actuator comprising a magnetic shape-memory alloy, wherein the actuator is at least partially arranged in the housing;
 (c) a drive by which the actuator may be deformed in such a way that at least one cavity for the fluid is formed in the actuator, wherein the cavity may be moved by the drive in order to transport the fluid in the cavity from the fluid inlet to the fluid outlet;
 (d) wherein at least one section of the actuator has a separation layer by which a direct contact between the fluid and the actuator is prevented in said section of the actuator; and
 (e) wherein the housing comprises at least two diffusors and wherein one of the diffusors is connected to the fluid inlet and another diffusor is connected to the fluid outlet, and wherein a side of each diffusor that is closer to the actuator has a larger cross-sectional area than a side of each diffusor that is more remote from the actuator, and wherein an opening of each diffusor adjacent to the actuator has a width in a direction transverse to the longitudinal axis that is greater than a width of the opening in a direction along the longitudinal axis.

34. A transport device for transporting a fluid, the transport device comprising:
 (a) a housing, wherein the housing has a fluid inlet and a fluid outlet;
 (b) an actuator comprising a magnetic shape-memory alloy, wherein the actuator is at least partially arranged in the housing; and
 (c) a drive by which the actuator may be deformed in such a way that at least one cavity for the fluid is formed in the actuator, wherein the cavity may be moved by the drive in order to transport the fluid in the cavity from the fluid inlet to the fluid outlet; and
 (d) wherein at least one section of the actuator has a separation layer by which a direct contact between the fluid and the actuator is prevented in said section of the actuator; and
 (e) wherein the housing delimits each at least one cavity and has at least in sections a PTFE coating.

35. A transport device for transporting a fluid, the transport device comprising:
 (a) a housing, wherein the housing has a fluid inlet and a fluid outlet;
 (b) an actuator comprising a magnetic shape-memory alloy, wherein the actuator is at least partially arranged in the housing; and
 (c) a drive, by which the actuator may be deformed in such a way that at least one cavity for the fluid is formed in the actuator, wherein the at least one cavity may be moved by the drive in order to transport the fluid in the at least one cavity from the fluid inlet to the fluid outlet; and
 (d) wherein at least one section of the actuator has a separation layer by which a direct contact between the fluid and the actuator is prevented in said section of the actuator;
 (e) wherein the transport device further comprises a sensor and wherein the sensor includes; and
  (i) a temperature sensor by which a temperature of the actuator may be detected,
  (ii) an optical sensor by which the presence of the at least one cavity in the actuator may be detected,
  (iii) a piezo sensor by which an actuation of the actuator may be detected, a strain gauge by which an actuation of the actuator may be detected, or
  (iv) a combination thereof.

* * * * *